US009607849B2

(12) United States Patent
Koumura et al.

(10) Patent No.: US 9,607,849 B2
(45) Date of Patent: *Mar. 28, 2017

(54) PATTERN-FORMING METHOD AND RESIST UNDERLAYER FILM-FORMING COMPOSITION

(71) Applicant: JSR CORPORATION, Tokyo (JP)

(72) Inventors: Kazuhiko Koumura, Tokyo (JP); Shinya Minegishi, Tokyo (JP); Takashi Mori, Tokyo (JP); Kyoyu Yasuda, Tokyo (JP); Yoshio Takimoto, Tokyo (JP); Shinya Nakafuji, Tokyo (JP); Toru Kimura, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/249,432

(22) Filed: Apr. 10, 2014

(65) Prior Publication Data

US 2014/0220783 A1    Aug. 7, 2014

Related U.S. Application Data

(63) Continuation of application No. PCT/JP2012/075568, filed on Oct. 2, 2012.

(30) Foreign Application Priority Data

Oct. 12, 2011 (JP) ................................ 2011-225381
Oct. 18, 2011 (JP) ................................ 2011-229297

(51) Int. Cl.
| G03F 7/09 | (2006.01) |
| G03F 7/20 | (2006.01) |
| H01L 21/027 | (2006.01) |
| H01L 21/308 | (2006.01) |
| H01L 21/311 | (2006.01) |
| H01L 21/02 | (2006.01) |
| H01L 21/033 | (2006.01) |

(52) U.S. Cl.
CPC .......... *H01L 21/3081* (2013.01); *G03F 7/094* (2013.01); *H01L 21/0271* (2013.01); *H01L 21/02164* (2013.01); *H01L 21/033* (2013.01); *H01L 21/31116* (2013.01); *H01L 21/31138* (2013.01)

(58) Field of Classification Search
None
See application file for complete search history.

(56) References Cited

U.S. PATENT DOCUMENTS

| 5,063,134 A * | 11/1991 | Horiguchi | C08G 8/06 430/165 |
| 6,316,165 B1 * | 11/2001 | Pavelchek | G03F 7/091 430/311 |
| 7,842,620 B2 * | 11/2010 | Takei et al. | 438/761 |
| 9,170,493 B2 * | 10/2015 | Minegishi | C08F 220/18 |
| 2002/0015909 A1 | 2/2002 | Mizutani et al. | |
| 2002/0173594 A1 | 11/2002 | De et al. | |
| 2003/0146416 A1 | 8/2003 | Takei et al. | |
| 2004/0034155 A1 * | 2/2004 | Sugita | C07C 33/38 524/543 |
| 2006/0068335 A1 | 3/2006 | Coley et al. | |
| 2006/0234158 A1 * | 10/2006 | Hatakeyama | 430/270.1 |
| 2007/0122740 A1 * | 5/2007 | Hatakeyama et al. | 430/270.1 |
| 2007/0238029 A1 * | 10/2007 | Takei | C08F 220/28 430/5 |
| 2008/0032231 A1 * | 2/2008 | Hatakeyama et al. | 430/270.1 |
| 2008/0206676 A1 | 8/2008 | De et al. | |
| 2009/0098486 A1 * | 4/2009 | Yoshimura et al. | 430/286.1 |
| 2010/0028802 A1 * | 2/2010 | Konno et al. | 430/270.1 |
| 2010/0104977 A1 * | 4/2010 | Hatakeyama et al. | 430/271.1 |
| 2011/0251323 A1 * | 10/2011 | Yoshimura et al. | 524/317 |
| 2012/0181251 A1 * | 7/2012 | Minegishi et al. | 216/49 |
| 2012/0184103 A1 * | 7/2012 | Ogihara et al. | 438/703 |
| 2012/0252217 A1 * | 10/2012 | Minegishi et al. | 438/703 |
| 2012/0270157 A1 * | 10/2012 | Minegishi et al. | 430/323 |
| 2013/0153535 A1 * | 6/2013 | Nakafuji et al. | 216/41 |
| 2013/0341304 A1 * | 12/2013 | Minegishi et al. | 216/47 |
| 2014/0048512 A1 * | 2/2014 | Nakafuji et al. | 216/49 |
| 2015/0197664 A1 * | 7/2015 | Minegishi | H01L 21/31144 524/360 |

FOREIGN PATENT DOCUMENTS

| JP | 62-001230 | * | 1/1987 |
| JP | 62-140425 | * | 6/1987 |
| JP | 63-016623 | * | 1/1988 |
| JP | 05-121371 | * | 5/1993 |
| JP | 11-154638 | | 6/1999 |

(Continued)

OTHER PUBLICATIONS

Machine translation of WO2012117948 (2012).*
Machine translation of WO 2011/040340 (Apr. 2011).*
International Search Report for corresponding International Application No. PCT/JP2012/075568, Oct. 30, 2012.
Office Action issued Jun. 14, 2016, in Japanese Patent Application No. 2013-538506 (w/ English translation).

*Primary Examiner* — Martin Angebranndt

(74) *Attorney, Agent, or Firm* — Oblon, McClelland, Maier & Neustadt, L.L.P.

(57) ABSTRACT

A pattern-forming method includes providing a resist underlayer film on a substrate using a resist underlayer film-forming composition. The resist underlayer film-forming composition includes a first polymer having a glass transition temperature of 0 to 180° C. A silicon-based oxide film is provided on a surface of the resist underlayer film. A resist pattern is provided on a surface of the silicon-based oxide film using a resist composition. The silicon-based oxide film and the resist underlayer film are sequentially dry-etched using the resist pattern as a mask. The substrate is dry-etched using the dry-etched resist underlayer film as a mask.

14 Claims, No Drawings

(56) References Cited

FOREIGN PATENT DOCUMENTS

| | | | |
|---|---|---|---|
| JP | 2000-098595 | | 4/2000 |
| JP | 2000-294504 | | 10/2000 |
| JP | 2001-284209 | | 10/2001 |
| JP | 2003-057828 | | 2/2003 |
| JP | 2003-119253 | | 4/2003 |
| JP | 2004-027184 | * | 1/2004 |
| JP | 2004-534107 | | 11/2004 |
| JP | 2005-084621 | * | 3/2005 |
| JP | 2005-241963 | | 9/2005 |
| JP | 2005-331951 | | 12/2005 |
| JP | 2006-285046 | * | 10/2006 |
| JP | 2009-251130 | * | 10/2009 |
| JP | 2010-520930 | | 6/2010 |
| WO | WO 2008/047715 | | 4/2008 |
| WO | 2011/040340 | * | 4/2011 |
| WO | WO 2011/040340 | | 4/2011 |
| WO | WO 2012/117948 | | 9/2012 |

\* cited by examiner

PATTERN-FORMING METHOD AND RESIST UNDERLAYER FILM-FORMING COMPOSITION

CROSS-REFERENCE TO RELATED APPLICATIONS

The present application is a continuation application of International Application No. PCT/JP2012/075568, filed Oct. 2, 2012, which claims priority to Japanese Patent Application No. 2011-225381, filed Oct. 12, 2011 and to Japanese Patent Application No. 2011-229297, filed Oct. 18, 2011. The contents of these applications are incorporated herein by reference in their entirety.

BACKGROUND OF THE INVENTION

Field of the Invention

The invention relates to a pattern-forming method and a resist underlayer film-forming composition.

Discussion of the Background

A reduction in processing size by utilizing a multilayer resist process has progressed in order to increase the degree of integration of semiconductor devices and the like (see Japanese Patent Application Publication (KOKAI) No. 2001-284209). The multilayer resist process includes applying a resist underlayer film-forming composition to a substrate to form a resist underlayer film, applying a resist composition to the resist underlayer film to form a resist film, transferring a mask pattern through exposure, and developing the resist film using a developer to form a resist pattern. The resist pattern is then transferred to the resist underlayer film by dry etching, and the pattern of the resist underlayer film is transferred to the substrate by dry etching to obtain a substrate having the desired pattern.

Along with diversification of semiconductor devices and the like, the substrate may be deeply etched depending on the application. For example, when a semiconductor device is used for 3D integration applications, it is necessary to etch the substrate to a depth of about 1 μm, and the resist underlayer film used to transfer such a deep pattern is required to have a thickness of about 0.7 μm.

SUMMARY OF THE INVENTION

According to one aspect of the present invention, a pattern-forming method includes providing a resist underlayer film on a substrate using a resist underlayer film-forming composition. The resist underlayer film-forming composition includes a first polymer having a glass transition temperature of 0 to 180° C. A silicon-based oxide film is provided on a surface of the resist underlayer film. A resist pattern is provided on a surface of the silicon-based oxide film using a resist composition. The silicon-based oxide film and the resist underlayer film are sequentially dry-etched using the resist pattern as a mask. The substrate is dry-etched using the dry-etched resist underlayer film as a mask.

According to another aspect of the present invention, a pattern-forming method includes providing a resist underlayer film on a substrate using a resist underlayer film-forming composition. The resist underlayer film-forming composition includes a first polymer having a glass transition temperature of 0 to 180° C., and a second polymer having a glass transition temperature of more than 180° C. A silicon-based oxide film is provided on a surface of the resist underlayer film. A resist pattern is provided on a surface of the silicon-based oxide film using a resist composition. The silicon-based oxide film and the resist underlayer film are sequentially dry-etched using the resist pattern as a mask. The substrate is dry-etched using the dry-etched resist underlayer film as a mask.

According to further aspect of the present invention, a resist underlayer film-forming composition includes a first polymer having a glass transition temperature of 0 to 180° C.; and a second polymer having a glass transition temperature of more than 180° C. The resist underlayer film-forming composition is used for a pattern-forming method that includes: applying the resist underlayer film-forming composition to a substrate; heating the resist underlayer film-forming composition at 180 to 350° C. to form a resist underlayer film; applying a silicon-based oxide film-forming composition to a surface of the resist underlayer film; heating the silicon-based oxide film-forming composition at 180 to 350° C. to form a silicon-based oxide film; providing a resist pattern on a surface of the silicon-based oxide film using a resist composition; sequentially dry-etching the silicon-based oxide film and the resist underlayer film using the resist pattern as a mask; and dry-etching the substrate using the dry-etched resist underlayer film as a mask.

DESCRIPTION OF THE EMBODIMENTS

According to one embodiment of the invention, a resist underlayer film-forming composition includes [A1] a polymer that has a glass transition temperature (Tg) of 0 to 180° C. (hereinafter may be referred to as "polymer [A1]").

When the polymer [A1] included in the resist underlayer film-forming composition according to the embodiment of the invention has a glass transition temperature (Tg) of 0 to 180° C., a residual stress in the resist underlayer film after heating can be reduced. This makes it possible to suppress warping of a substrate even when a resist underlayer film having a relatively large thickness is formed using the resist underlayer film-forming composition, and form a resist underlayer film that exhibits excellent etching resistance and excellent crack resistance. Therefore, a deep pattern can be transferred to a substrate while suppressing occurrence of cracks when performing a dry etching process that includes forming an inorganic film on the resist underlayer film, for example. Note that the term "multilayer resist process" used herein refers to a multi-step process that normally includes forming a resist underlayer film on a substrate, forming a resist pattern on the resist underlayer film, transferring the resist pattern to the resist underlayer film to form an underlayer film pattern, and transferring the resist pattern to the substrate using the underlayer film pattern as an etching mask, for example.

It is preferable to use the resist underlayer film-forming composition for a multilayer resist process that includes forming a silicon-based oxide film on the surface of a resist underlayer film, and dry-etching the silicon-based oxide film. Since the resist underlayer film-forming composition can suppress warping of a substrate, and can form a resist underlayer film that exhibits excellent etching resistance and excellent crack resistance, the resist underlayer film-forming composition can suitably be used for such an application.

It is preferable that the resist underlayer film-forming composition further include [B] an acid generator (hereinafter may be referred to as "acid generator [B]").

The acid generator [B] is a component that generates an acid upon exposure or heating. When the resist underlayer film-forming composition includes the acid generator [B], a crosslinking reaction of the polymer [A1] is promoted.

It is preferable that the polymer [A1] include at least one structural unit selected from the group consisting of a structural unit (I) represented by the following formula (1), a structural unit (II) represented by the following formula (2), and a structural unit (IV) represented by the following formula (4).

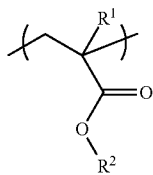

wherein $R^1$ is a hydrogen atom, a fluorine atom, a methyl group, or a trifluoromethyl group, and $R^2$ is a monovalent hydrocarbon group.

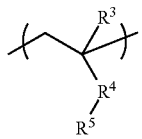

wherein $R^3$ is a hydrogen atom, a fluorine atom, a methyl group, or a trifluoromethyl group, $R^4$ is a single bond or a chain-like hydrocarbon group having 1 to 4 carbon atoms, and $R^5$ is a phenyl group, a naphthyl group, or an anthranyl group, provided that some or all of the hydrogen atoms of the phenyl group, the naphthyl group, or the anthranyl group are optionally substituted with an alkyl group.

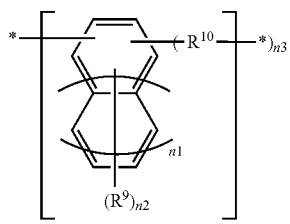

wherein $R^9$ is a hydroxyl group, a mercapto group, an amino group, a halogen atom, a hydrocarbon group having 1 to 20 carbon atoms, an $-OR^{11}$ group, or a $-COOR^{12}$ group, $R^{11}$ is a hydrocarbon group having 1 to 20 carbon atoms, provided that some or all of the hydrogen atoms of the hydrocarbon group are optionally substituted with a hydroxyl group or an epoxy group, $R^{12}$ is a hydrocarbon group having 1 to 20 carbon atoms, $R^{10}$ is an alkanediyl group having 1 to 10 carbon atoms, an arylene group having 6 to 14 carbon atoms, or an alkylene ether group, provided that some or all of the hydrogen atoms of the alkanediyl group, the arylene group, or the alkylene ether group are optionally substituted with an alkyl group, n1 is 0 or 1, n2 is an integer from 1 to 4 when n1 is 0, and is an integer from 1 to 6 when n1 is 1, n3 is an integer from 1 to 4, provided that $1 \leq n2+n3 \leq 4$ is satisfied when n1 is 0, $1 \leq n2+n3 \leq 6$ is satisfied when n1 is 1, a plurality of $R^9$ are either identical or different when a plurality of $R^9$ are present, and a plurality of $R^{10}$ are either identical or different when a plurality of $R^{10}$ are present, and * is a bonding site.

When the polymer [A1] includes the above specific structural unit, the polymer [A1] has a relatively low glass transition temperature (Tg). As a result, a resist underlayer film that is formed using the resist underlayer film-forming composition that includes the polymer [A1] exhibits more excellent etching resistance and crack resistance, and warping of the substrate can be further suppressed.

It is preferable that the polymer [A1] include a structural unit (III) that includes a $-CH_2OH$ group and an aromatic group. When the polymer [A1] includes the structural unit (III), the polymer [A1] exhibits an improved crosslinking capability.

The resist underlayer film-forming composition preferably further includes [A2] a polymer having a glass transition temperature (Tg) of more than 180° C. (hereinafter may be referred to as "polymer [A2]").

When the resist underlayer film-forming composition further includes the polymer [A2] having a glass transition temperature (Tg) of more than 180° C. in addition to the polymer [A1], the etching resistance of the resulting resist underlayer film can be improved.

It is preferable that the resist underlayer film-forming composition include the polymer [A1] in an amount of 10 to 40 parts by mass based on 100 parts by mass of the polymer [A1] and the polymer [A2] in total. When the amount of the polymer [A1] is within the above specific range, warping of a substrate can be further suppressed.

It is preferable that the polymer [A1] have a glass transition temperature (Tg) of 70 to 150° C. When the glass transition temperature (Tg) of the polymer [A1] is within the above specific range, warping of a substrate can be further suppressed.

It is preferable that the polymer [A2] have a glass transition temperature (Tg) of 200° C. or more. When the glass transition temperature (Tg) of the polymer [A2] is within the above specific range, warping of a substrate can be further suppressed.

It is preferable that the polymer [A1] include at least one structural unit selected from the group consisting of the structural unit (I) represented by the following formula (1), the structural unit (II) represented by the following formula (2), the structural unit (III) that includes a $-CH_2OH$ group and an aromatic group, and the structural unit (IV) represented by the following formula (4).

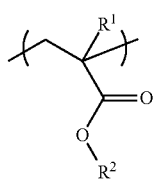

wherein $R^1$ is a hydrogen atom, a fluorine atom, a methyl group, or a trifluoromethyl group, and $R^2$ is a monovalent hydrocarbon group.

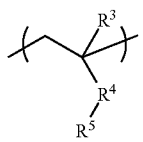
(2)

wherein $R^3$ is a hydrogen atom, a fluorine atom, a methyl group, or a trifluoromethyl group, $R^4$ is a single bond or a chain-like hydrocarbon group having 1 to 4 carbon atoms, and $R^5$ is a phenyl group, a naphthyl group, or an anthranyl group, provided that some or all of the hydrogen atoms of the phenyl group, the naphthyl group, or the anthranyl group are optionally substituted with an alkyl group.

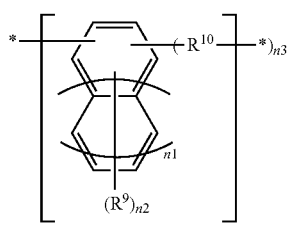
(4)

wherein $R^9$ is a hydroxyl group, a mercapto group, an amino group, a halogen atom, a hydrocarbon group having 1 to 20 carbon atoms, an —$OR^{11}$ group, or a —$COOR^{12}$ group, $R^{11}$ is a hydrocarbon group having 1 to 20 carbon atoms, provided that some or all of the hydrogen atoms of the hydrocarbon group are optionally substituted with a hydroxyl group or an epoxy group, $R^{12}$ is a hydrocarbon group having 1 to 20 carbon atoms, $R^{10}$ is an alkanediyl group having 1 to 10 carbon atoms, an arylene group having 6 to 14 carbon atoms, or an alkylene ether group, provided that some or all of the hydrogen atoms of the alkanediyl group, the arylene group, or the alkylene ether group are optionally substituted with an alkyl group, n1 is 0 or 1, n2 is an integer from 1 to 4 when n1 is 0, and is an integer from 1 to 6 when n1 is 1, n3 is an integer from 1 to 4, provided that $1 \leq n2+n3 \leq 4$ is satisfied when n1 is 0, $1 \leq n2+n3 \leq 6$ is satisfied when n1 is 1, a plurality of $R^9$ are either identical or different when a plurality of $R^9$ are present, and a plurality of $R^{10}$ are either identical or different when a plurality of $R^{10}$ are present, and * is a bonding site.

When the polymer [A1] includes the above specific structural unit, the polymer [A1] has a relatively low glass transition temperature (Tg). As a result, warping of the substrate can be further suppressed when a resist underlayer film is formed using the resist underlayer film-forming composition that includes the polymer [A1].

It is preferable that the polymer [A2] include at least one structural unit selected from the group consisting of a structural unit (V) represented by the following formula (5), a structural unit (VI) represented by the following formula (6), a structural unit (VII) represented by the following formula (7), and a structural unit (VIII) that includes a fullerene skeleton. When the polymer [A2] includes the above specific structural unit, the polymer [A2] has a relatively high glass transition temperature (Tg). As a result, a resist underlayer film formed using the resist underlayer film-forming composition that includes the polymer [A2] exhibits more excellent etching resistance.

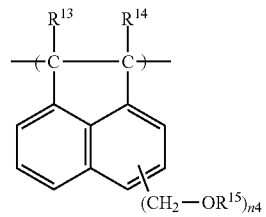
(5)

wherein $R^{13}$ and $R^{14}$ are independently a hydrogen atom, a halogen atom, an alkyl group having 1 to 6 carbon atoms, an alkoxy group having 1 to 6 carbon atoms, an alkoxycarbonyl group having 2 to 10 carbon atoms, or an aryl group having 6 to 14 carbon atoms, provided that some or all of the hydrogen atoms of the alkyl group, the alkoxy group, the alkoxycarbonyl group, or the aryl group are optionally substituted with an alkyl group, $R^{15}$ is an alkyl group having 1 to 6 carbon atoms, an acyl group having 2 to 10 carbon atoms, or an aryl group having 6 to 14 carbon atoms, provided that some or all of the hydrogen atoms of the alkyl group, the acyl group, or the aryl group are optionally substituted with an alkyl group, and n4 is 0 or 1.

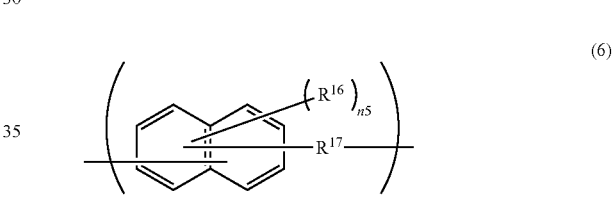
(6)

wherein $R^{16}$ is a hydroxyl group, a mercapto group, an amino group, a halogen atom, a hydrocarbon group having 1 to 20 carbon atoms, an —$OR^{18}$ group, or a —$COOR^{19}$ group, $R^{18}$ is a hydrocarbon group having 1 to 20 carbon atoms, provided that some or all of the hydrogen atoms of the hydrocarbon group are optionally substituted with a hydroxyl group or an epoxy group, $R^{19}$ is a monovalent hydrocarbon group having 1 to 20 carbon atoms, n5 is an integer from 0 to 6, provided that a plurality of $R^{16}$ are either identical or different when a plurality of $R^{16}$ are present, and $R^{17}$ is a single bond, an alkanediyl group having 1 to 10 carbon atoms, an arylene group having 6 to 14 carbon atoms, or an alkylene ether group, provided that some or all of the hydrogen atoms of the alkanediyl group, the arylene group, or the alkylene ether group are optionally substituted with an alkyl group.

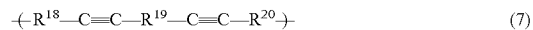
(7)

wherein $R^{18}$ to $R^{20}$ are independently a single bond or a divalent organic group, provided that a case where all of $R^{18}$ to $R^{20}$ are single bonds is excluded.

It is preferable that the resist underlayer film-forming composition further include the acid generator [B]. The acid generator [B] is a component that generates an acid upon exposure or heating. When the resist underlayer film-forming composition includes the acid generator [B], a crosslinking reaction of the polymer [A1] and/or the polymer [A2] is promoted.

It is preferable that the resist underlayer film-forming composition further include [C] a crosslinking agent (hereinafter may be referred to as "crosslinking agent [C]"). When the resist underlayer film-forming composition further includes the crosslinking agent [C], a crosslinking reaction of the polymer [A1] and/or the polymer [A2] is further promoted.

According to another embodiment of the invention, a method for producing a resist underlayer film-forming composition includes mixing the polymer [A1] having a glass transition temperature (Tg) of 0 to 180° C. and the polymer [A2] having a glass transition temperature (Tg) of more than 180° C.

This method can easily produce a resist underlayer film-forming composition that can suppress warping of a substrate.

According to the embodiment of the invention, a pattern-forming method includes:
(1) forming a resist underlayer film on a substrate using the resist underlayer film-forming composition;
(2) forming a silicon-based oxide film on the surface of the resist underlayer film;
(3) applying a resist composition to the surface of the silicon-based oxide film, followed by exposure, heating, and development to form a resist pattern;
(4) sequentially dry-etching the silicon-based oxide film and the resist underlayer film using the resist pattern as a mask; and
(5) dry-etching the substrate using the resist underlayer film dry-etched in the step (4) as a mask.

According to the pattern-forming method, it is possible to form a resist underlayer film while suppressing warping of the substrate, and transfer a deep pattern to the substrate.

According to another embodiment of the invention, a resist underlayer film is formed using the resist underlayer film-forming composition. When the resist underlayer film is formed using the resist underlayer film-forming composition, the resist underlayer film exhibits excellent etching resistance and excellent crack resistance while suppressing warping of a substrate.

Note that the term "glass transition temperature (Tg)" used herein refers to a temperature at which a non-crystalline solid material undergoes a glass transition, and refers to a value measured by differential scanning calorimetry (DSC) at a temperature increase rate of 20° C./min. The term "static contact angle" used herein refers to an angle formed by a stationary liquid droplet that has been dropped onto the resist underlayer film with the surface of the resist underlayer film. The static contact angle may be measured using various means. For example, the resist underlayer film-forming composition is spin-coated onto an 8-inch silicon wafer, heated at 180° C. for 60 seconds using a hot plate (oxygen concentration: 20 vol %), and heated at 300° C. for 60 seconds to form a resist underlayer film having a thickness of 0.1 μm. The static contact angle)(°) formed by the resist underlayer film and water is measured using a contact angle meter ("DLA10L2E" manufactured by KURRS).

The resist underlayer film-forming composition can suppress warping of a substrate, can form a resist underlayer film that exhibits excellent etching resistance and excellent crack resistance, and may suitably be used when transferring a deep pattern to a substrate by dry etching. Therefore, the resist underlayer film-forming composition may suitably be used for production of semiconductor devices and the like that are expected to be further diversified in the future. The embodiments will now be described in detail.

Resist Underlayer Film-forming Composition

The resist underlayer film-forming composition includes the polymer [A1] having a glass transition temperature (Tg) of 0 to 180° C. Therefore, even when a resist underlayer film having a relatively large thickness is formed using the resist underlayer film-forming composition, it is possible to reduce a residual stress in the resist underlayer film due to heating, and suppress warping of the substrate. It is also possible to form a resist underlayer film that exhibits excellent etching resistance and excellent crack resistance. This makes it possible to transfer a deep pattern to the substrate while suppressing occurrence of cracks when performing a dry etching process that includes forming an inorganic film on the resist underlayer film, for example.

Examples of the resist underlayer film-forming composition include a resist underlayer film-forming composition (I), a resist underlayer film-forming composition (II), and the like. The resist underlayer film-forming composition (I) may suitably be used for a multilayer resist process that includes forming a silicon-based oxide film on the surface of the resist underlayer film, and dry-etching the silicon-based oxide film. The resist underlayer film-forming composition (II) can improve the etching resistance of the resist underlayer film.

The resist underlayer film-forming composition (II) includes the polymer [A2] in addition to the polymer [A1]. The resist underlayer film-forming composition may include the acid generator [B] and the crosslinking agent [C] as preferable components. The resist underlayer film-forming composition may further include an additional optional component as long as the advantageous effects of the invention are not impaired. Each component is described in detail below.

Polymer [A1]

The polymer [A1] is not particularly limited as long as the polymer [A1] has a glass transition temperature (Tg) of 0 to 180° C. It is preferable that the polymer [A1] include at least one structural unit selected from the group consisting of the structural unit (I) represented by the formula (1), the structural unit (II) represented by the formula (2), and the structural unit (IV) represented by the formula (4). When the polymer [A1] includes the above specific structural unit, the polymer [A1] has a relatively low glass transition temperature (Tg). As a result, a resist underlayer film that is formed using the resist underlayer film-forming composition that includes the polymer [A1] exhibits more excellent etching resistance and crack resistance, and warping of the substrate can be further suppressed. It is preferable that the polymer [A1] include the structural unit (III) that includes a —$CH_2OH$ group and an aromatic group. When the polymer [A1] includes the structural unit (III), the polymer [A1] exhibits an improved crosslinking capability. The polymer (A) may include a structural unit (V) (described later) and the like in addition to the structural units (I) to (IV) as long as the advantageous effects of the invention are not impaired. Note that the polymer [A1] may include two or more types of each structural unit. Each structural unit is described in detail below.

Structural Unit (I)

The structural unit (I) is represented by the formula (1). In the formula (1), $R^1$ is a hydrogen atom, a fluorine atom, a methyl group, or a trifluoromethyl group, and $R^2$ is a monovalent hydrocarbon group.

Examples of the monovalent hydrocarbon group represented by $R^2$ include a monovalent aromatic hydrocarbon group, a monovalent chain-like hydrocarbon group, and the like. Examples of the monovalent aromatic hydrocarbon group include an aromatic hydrocarbon group having 6 to 12 carbon atoms, and the like. Specific examples of the monovalent aromatic hydrocarbon group include a phenyl group, a naphthyl group, and the like. Examples of the monovalent chain-like hydrocarbon group include a methyl group, an ethyl group, a propyl group, a butyl group, and the like.

Examples of the structural unit (I) include structural units respectively represented by the following formulas, and the like.

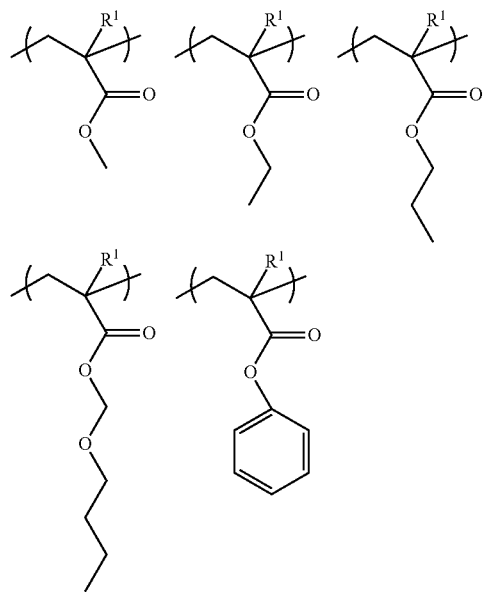

wherein $R^1$ is the same as defined for the formula (1).

The content of the structural unit (I) in the polymer [A1] is preferably 1 to 50 mol %, and more preferably 5 to 40 mol %, based on the total structural units included in the polymer [A1]. When the content of the structural unit (I) is within the above specific range, the polymer [A1] has a relatively low glass transition temperature (Tg).

Structural Unit (II)

The structural unit (II) is represented by the formula (2). In the formula (2), $R^3$ is a hydrogen atom, a fluorine atom, a methyl group, or a trifluoromethyl group, $R^4$ is a single bond or a chain-like hydrocarbon group having 1 to 4 carbon atoms, and $R^5$ is a phenyl group, a naphthyl group, or an anthranyl group, provided that some or all of the hydrogen atoms of the phenyl group, the naphthyl group, or the anthranyl group are optionally substituted with an alkyl group.

Examples of the chain-like hydrocarbon group having 1 to 4 carbon atoms represented by $R^4$ include a methyl group, an ethyl group, a propyl group, a butyl group, and the like.

Examples of the structural unit (II) include structural units respectively represented by the following formulas, and the like.

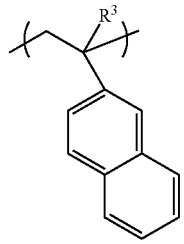

wherein $R^3$ is the same as defined for the formula (2).

The content of the structural unit (II) in the polymer [A1] is preferably 30 to 80 mol %, and more preferably 40 to 70 mol %, based on the total structural units included in the polymer [A1]. When the content of the structural unit (II) is within the above specific range, the etching resistance of the resist underlayer film can be improved while ensuring that the polymer [A1] has a relatively low glass transition temperature (Tg).

Structural Unit (III)

The structural unit (III) includes a —CH$_2$OH group and an aromatic group. Examples of the structural unit (III) include a structural unit represented by the following formula (3), and the like.

(3)

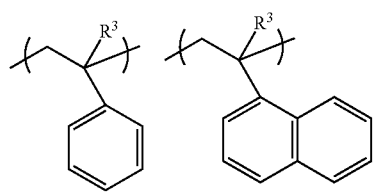

wherein $R^6$ is a hydrogen atom, a fluorine atom, a methyl group, or a trifluoromethyl group, $R^7$ is a single bond or a chain-like hydrocarbon group having 1 to 4 carbon atoms, and $R^8$ is a phenyl group, a naphthyl group, or an anthranyl group, provided that some or all of the hydrogen atoms of the phenyl group, the naphthyl group, or the anthranyl group are substituted with a —CH$_2$OH group.

Specific examples of the structural unit represented by the formula (3) include the structural units respectively represented by the following formulas, and the like.

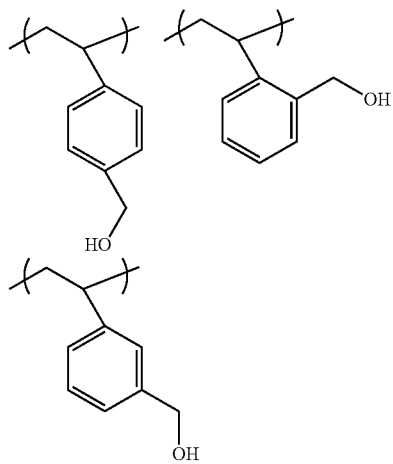

The content of the structural unit (III) in the polymer [A1] is preferably 1 to 50 mol %, and more preferably 5 to 40 mol %, based on the total structural units included in the polymer

[A1]. When the content of the structural unit (III) is within the above specific range, the polymer [A1] exhibits a more appropriate crosslinking capability.

Structural Unit (IV)

The structural unit (IV) is represented by the formula (4). In the formula (4), $R^9$ is a hydroxyl group, a mercapto group, an amino group, a halogen atom, a hydrocarbon group having 1 to 20 carbon atoms, an —$OR^{11}$ group, or a —$COOR^{12}$ group, $R^{11}$ is a hydrocarbon group having 1 to 20 carbon atoms, provided that some or all of the hydrogen atoms of the hydrocarbon group are optionally substituted with a hydroxyl group or an epoxy group, $R^{12}$ is a hydrocarbon group having 1 to 20 carbon atoms, $R^{10}$ is an alkanediyl group having 1 to 10 carbon atoms, an arylene group having 6 to 14 carbon atoms, or an alkylene ether group, provided that some or all of the hydrogen atoms of the alkanediyl group, the arylene group, or the alkylene ether group are optionally substituted with an alkyl group, n1 is 0 or 1, n2 is an integer from 1 to 4 when n1 is 0, and is an integer from 1 to 6 when n1 is 1, n3 is an integer from 1 to 4, provided that $1 \leq n2+n3 \leq 4$ is satisfied when n1 is 0, $1 \leq n2+n3 \leq 6$ is satisfied when n1 is 1, a plurality of $R^9$ are either identical or different when a plurality of $R^9$ are present, and a plurality of $R^{10}$ are either identical or different when a plurality of $R^{10}$ are present, and * is a bonding site.

Examples of the monovalent hydrocarbon group having 1 to 20 carbon atoms represented by $R^9$, $R^{11}$, and $R^{12}$ include a monovalent chain-like hydrocarbon group having 1 to 20 carbon atoms, a monovalent cyclic hydrocarbon group having 3 to 20 carbon atoms, a monovalent aromatic hydrocarbon group having 6 to 20 carbon atoms, and the like.

Examples of the monovalent chain-like hydrocarbon group having 1 to 20 carbon atoms include monovalent saturated hydrocarbon groups such as a methyl group, an ethyl group, an n-propyl group, an i-propyl group, an n-butyl group, an i-butyl group, a sec-butyl group, a tert-butyl group, an n-pentyl group, an isopentyl group, a sec-pentyl group, and a tert-pentyl group; monovalent unsaturated chain-like hydrocarbon groups such as an ethenyl group, a propenyl group, a butenyl group, a pentenyl group, an ethynyl group, and a propynyl group; and the like.

Examples of the monovalent cyclic hydrocarbon group having 3 to 20 carbon atoms include monovalent monocyclic saturated hydrocarbon groups such as a cyclobutyl group, a cyclopentyl group, a cyclohexyl group, a cycloheptyl group, and a cyclooctyl group; monovalent monocyclic unsaturated hydrocarbon groups such as a cyclobutenyl group, a cyclopentenyl group, and a cyclohexenyl group; monovalent polycyclic hydrocarbon groups such as a norbornyl group, an adamantyl group, a tricyclodecyl group, and a tetracyclododecyl group; and the like.

Examples of the monovalent aromatic hydrocarbon group having 6 to 20 carbon atoms include a phenyl group, a methylphenyl group, a naphthyl group, a methylnaphthyl group, an anthryl group, a methylanthryl group, and the like.

Examples of the epoxy group represented by $R^{11}$ include an oxetanyl group, an oxiranyl group, and the like. Examples of the hydrocarbon group represented by $R^{11}$ of which some or all of the hydrogen atoms are substituted with an epoxy group include a glycidyl group and the like. Examples of the hydrocarbon group represented by $R^{11}$ of which some or all of the hydrogen atoms are substituted with a hydroxyl group include a methylol group, a 2-hydroxyethyl group, a 3-hydroxypropyl group, and the like.

Examples of the —$OR^{11}$ group represented by $R^9$ include a methoxy group, an ethoxy group, a propoxy group, a butoxy group, and the like.

Examples of the —$COOR^{12}$ group represented by $R^9$ include a methoxycarbonyl group, an ethoxycarbonyl group, a propoxycarbonyl group, a butoxycarbonyl group, and the like.

Examples of the alkanediyl group having 1 to 10 carbon atoms represented by $R^{10}$ include a methanediyl group, an ethanediyl group, and the like.

Examples of the arylene group having 6 to 14 carbon atoms represented by $R^{10}$ include a phenylene group, a naphthylene group, an anthrylene group, and the like.

Examples of the alkylene ether group represented by $R^{10}$ include an ethylene ether group, a propylene ether group, and the like. The number of carbon atoms of the alkylene moiety of the alkylene ether group is preferably 2 to 20.

Examples of the structural unit (IV) include the structural units respectively represented by the following formulas, and the like.

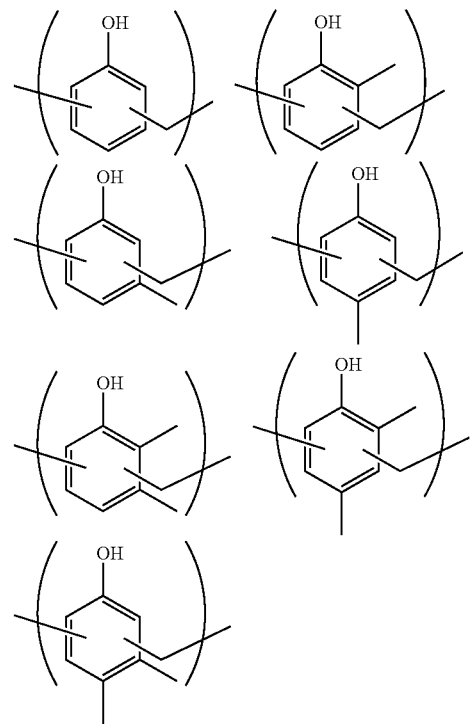

The content of the structural unit (IV) in the polymer [A1] is preferably 10 to 100 mol % based on the total structural units included in the polymer [A1]. When the content of the structural unit (IV) is within the above specific range, the polymer [A1] has a relatively low glass transition temperature (Tg).

The polymer [A1] may include a structural unit other than the structural units (I) to (IV) as long as the advantageous effects of the invention are not impaired.

The glass transition temperature (Tg) of the polymer [A1] included in the resist underlayer film-forming composition is 0 to 180° C., preferably 40 to 160° C., and more preferably 70 to 150° C.

Method for Synthesizing Polymer [A1]

The polymer [A1] may be synthesized by polymerizing a monomer that produces each structural unit in an appropriate solvent using a radical initiator, for example. The polymer [A1] may also be synthesized by crosslinking a specific compound (e.g., phenol), or a polymer obtained as described above, using an aldehyde in the presence of an acid catalyst or the like. The polymer [A1] is preferably synthesized by adding a solution including a monomer and a radical initiator dropwise to a reaction solvent or a solution including a monomer to effect polymerization, adding a solution including a monomer and a solution including a radical initiator dropwise to a reaction solvent or a solution including a monomer to effect polymerization, or adding a plurality of solutions respectively including a monomer and a solution including a radical initiator dropwise to a reaction solvent or a solution including a monomer to effect polymerization, for example.

The reaction temperature employed for the above synthesis method may be appropriately determined depending on the type of initiator, but is normally 30 to 180° C., preferably 40 to 160° C., and more preferably 50 to 140° C. The total reaction time including the dropwise addition time may be appropriately determined depending on the reaction temperature, the type of the initiator, the type of each monomer, and the like, but is normally 30 minutes to 12 hours, and preferably 1 to 8 hours.

Examples of the radical initiator used for polymerization include 2,2'-azobisisobutyronitrile, 2,2'-azobis(4-methoxy-2,4-dimethylvaleronitrile), 2,2'-azobis(2-cyclopropylpropionitrile), 2,2'-azobis(2,4-dimethylvaleronitrile), 2,2'-azobis (2-methylpropionitrile), dimethyl 2,2-azobis(isobutyrate), and the like. These initiators may be used either alone or in combination.

An arbitrary solvent that is other than a solvent that hinders polymerization (e.g., nitrobenzene having a polymerization inhibiting effect, or a mercapto compound having a chain transfer effect), and can dissolve each monomer and a polymer synthesized therefrom, may be used as the polymerization solvent. Examples of the polymerization solvent include ketone-based solvents, amide-based solvents, ester-lactone-based solvents, nitrile-based solvents, a mixed solvent thereof, and the like. These solvents may be used either alone or in combination.

Examples of the aldehyde used for the crosslinking reaction include saturated aliphatic aldehydes such as formaldehyde, paraformaldehyde, acetaldehyde, and propylaldehyde; unsaturated aliphatic aldehydes such as acrolein and methacrolein; heterocyclic aldehydes such as furfural; aromatic aldehydes such as benzaldehyde, naphthylaldehyde, and anthraldehyde; and the like. Among these, formaldehyde and paraformaldehyde are preferable. These aldehydes may be used either alone or in combination. The aldehyde is preferably used in an amount of 10 to 100 parts by mass based on 100 parts by mass of the specific compound (e.g., phenol).

Examples of the acid catalyst used for the crosslinking reaction include mineral acids such as sulfuric acid, phosphoric acid, and perchloric acid; organic sulfonic acids such as p-toluenesulfonic acid; carboxylic acids such as formic acid and oxalic acid; and the like. The acid catalyst is used in an appropriate amount depending on the type of acid. For example, the acid catalyst is normally used in an amount of 0.001 to 1000 parts by mass, preferably 0.01 to 100 parts by mass, and more preferably 0.1 to 10 parts by mass, based on 100 parts by mass of the specific compound (e.g., phenol).

The crosslinking reaction temperature is preferably 40 to 200° C. The crosslinking reaction time is appropriately determined depending on the reaction temperature, but is normally 30 minutes to 72 hours.

The polymer obtained by the polymerization reaction, the crosslinking reaction, or the like is preferably collected by reprecipitation. Specifically, the reaction mixture is poured into a reprecipitation solvent after completion of the reaction to collect the target polymer as a powder. An alcohol, an alkane, or the like may be used as the reprecipitation solvent either alone or in combination. The polymer may also be collected by removing low-molecular-weight components (e.g., monomer and oligomer) by a separation operation, a column operation, ultrafiltration, or the like.

The polystyrene-reduced weight average molecular weight (Mw) of the polymer [A1] determined by gel permeation chromatography (GPC) is not particularly limited, but is preferably 1000 to 50,000, and more preferably 2000 to 40,000. If the Mw of the polymer [A1] is less than 1000, the resist underlayer film-forming composition may exhibit a deterioration in film-forming capability when forming a resist underlayer film. If the Mw of the polymer [A1] exceeds 50,000, the resulting resist underlayer film may exhibit insufficient adhesion.

Note that the term "Mw" used herein refers to a value determined by gel permeation chromatography (GPC) using GPC columns manufactured by Tosoh Corporation (G2000HXL×2, G2000HXL×2, G3000HXL×1) at a flow rate of 1.0 ml/min and a column temperature of 40° C. (eluant: tetrahydrofuran, standard: monodisperse polystyrene).

Polymer [A2]

The polymer [A2] has a glass transition temperature (Tg) of more than 180° C. The polymer [A2] is not particularly limited as long as the polymer [A2] has a glass transition temperature (Tg) of more than 180° C. It is preferable that the polymer [A2] include at least one structural unit selected from the group consisting of the structural unit (V) represented by the formula (5), the structural unit (VI) represented by the formula (6), the structural unit (VII) represented by the formula (7), and the structural unit (VIII) that includes a fullerene skeleton. When the polymer [A2] includes the above specific structural unit, the polymer [A2] has a relatively high glass transition temperature (Tg). As a result, a resist underlayer film formed using the resist underlayer film-forming composition that includes the polymer [A2] exhibits more excellent etching resistance. Note that the polymer [A2] may include two or more types of each structural unit. Each structural unit is described in detail below.

Structural Unit (V)

The structural unit (V) is represented by the formula (5). In the formula (5), $R^{13}$ and $R^{14}$ are independently a hydrogen atom, a halogen atom, an alkyl group having 1 to 6 carbon atoms, an alkoxy group having 1 to 6 carbon atoms, an alkoxycarbonyl group having 2 to 10 carbon atoms, or an aryl group having 6 to 14 carbon atoms, provided that some or all of the hydrogen atoms of the alkyl group, the alkoxy group, the alkoxycarbonyl group, or the aryl group are optionally substituted with an alkyl group, $R^{15}$ is an alkyl group having 1 to 6 carbon atoms, an acyl group having 2 to 10 carbon atoms, or an aryl group having 6 to 14 carbon atoms, provided that some or all of the hydrogen atoms of the alkyl group, the acyl group, or the aryl group are optionally substituted with an alkyl group, and n4 is 0 or 1.

Examples of the alkyl group having 1 to 6 carbon atoms and the aryl group having 6 to 14 carbon atoms represented by $R^{13}$, $R^{14}$, and $R^{15}$ include the groups mentioned above in connection with the structural units (I) to (IV), and the like.

Examples of the alkoxycarbonyl group having 2 to 10 carbon atoms represented by $R^{13}$ and $R^{14}$ include a methoxycarbonyl group, an ethoxycarbonyl group, a propoxycarbonyl group, a butoxycarbonyl group, and the like.

Examples of the acyl group having 2 to 10 carbon atoms represented by $R^{15}$ include an acetyl group, a propionyl group, a butyryl group, an isobutyryl group, and the like.

Examples of the structural unit (V) include the structural unit represented by the following formula, and the like.

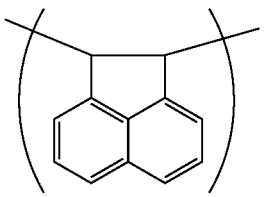

The content of the structural unit (V) in the polymer [A2] is preferably 10 to 90 mol % based on the total structural units included in the polymer [A2]. When the content of the structural unit (V) is within the above specific range, the polymer [A2] has a relatively high glass transition temperature (Tg).

Structural Unit (VI)

The structural unit (VI) is represented by the formula (6). In the formula (6), $R^{16}$ is a hydroxyl group, a mercapto group, an amino group, a halogen atom, a hydrocarbon group having 1 to 20 carbon atoms, an —$OR^{18}$ group, or a —$COOR^{19}$ group, $R^{18}$ is a monovalent hydrocarbon group having 1 to 20 carbon atoms, provided that some or all of the hydrogen atoms of the hydrocarbon group are optionally substituted with a hydroxyl group or an epoxy group, $R^{19}$ is a hydrocarbon group having 1 to 20 carbon atoms, n5 is an integer from 0 to 6, provided that a plurality of $R^{16}$ are either identical or different when a plurality of $R^{16}$ are present, and $R^{17}$ is a single bond, an alkanediyl group having 1 to 10 carbon atoms, an arylene group having 6 to 14 carbon atoms, or an alkylene ether group, provided that some or all of the hydrogen atoms of the alkanediyl group, the arylene group, or the alkylene ether group are optionally substituted with an alkyl group.

Examples of the monovalent hydrocarbon group having 1 to 20 carbon atoms represented by $R^{16}$, $R^{18}$, and $R^{19}$, the substituent that may substitute the monovalent hydrocarbon group having 1 to 20 carbon atoms, the alkanediyl group having 1 to 10 carbon atoms, the arylene group having 6 to 14 carbon atoms, and the alkylene ether group represented by $R^{17}$ include the groups mentioned above in connection with the structural units (I) to (IV), and the like.

The content of the structural unit (VI) in the polymer [A2] is preferably 10 to 100 mol % based on the total structural units included in the polymer [A2]. When the content of the structural unit (VI) is within the above specific range, the polymer [A2] has a relatively high glass transition temperature (Tg).

Structural Unit (VII)

The structural unit (VII) is represented by the formula (7). In the formula (7), $R^{18}$ to $R^{29}$ are independently a single bond or a divalent organic group, provided that a case where all of $R^{18}$ to $R^{29}$ are single bonds is excluded.

Examples of the divalent organic group represented by $R^{18}$ to $R^{29}$ include a divalent aromatic group, a divalent saturated aliphatic group, a divalent unsaturated aliphatic group, and the like. Examples of the divalent aromatic group include a phenylene group, a tolylene group, a dimethylphenylene group, a trimethylphenylene group, an aminophenylene group, a pyridylene group, an ethynylphenylene group, a biphenylene group, a naphthylene group, and the like. Examples of the divalent saturated aliphatic group include linear or branched alkanediyl groups having 1 to 6 carbon atoms such as a methanediyl group and an ethanediyl group; alicyclic alkanediyl groups having 1 to 10 carbon atoms such as a cyclopentanediyl group and a cyclohexanediyl group; and the like. Examples of the divalent unsaturated aliphatic group include linear or branched alkenylene groups having 2 to 6 carbon atoms such as a vinylidene group, an allylene group, a 1-butenediyl group, and a 2-butenediyl group; and the like.

The content of the structural unit (VII) in the polymer [A2] is preferably 10 to 100 mol % based on the total structural units included in the polymer [A2]. When the content of the structural unit (VII) is within the above specific range, the polymer [A2] has a relatively high glass transition temperature (Tg).

Structural Unit (VIII)

The structural unit (VIII) includes a fullerene skeleton. The structural unit (VIII) is not particularly limited as long as the structural unit (VIII) includes a fullerene skeleton. The content of the structural unit (VIII) in the polymer [A2] is preferably 10 to 100 mol % based on the total structural units included in the polymer [A2]. When the content of the structural unit (VIII) is within the above specific range, the polymer [A2] has a relatively high glass transition temperature (Tg).

The polymer [A2] may include a structural unit other than the structural units (V) to (VIII) as long as the advantageous effects of the invention are not impaired.

The glass transition temperature (Tg) of the polymer [A2] included in the resist underlayer film-forming composition is more than 180° C., and preferably 200° C. or more.

It is preferable that the resist underlayer film-forming composition include the polymer [A2] in an amount of 60 to 90 parts by mass based on the total amount of the polymer [A1] and the polymer [A2]. When the amount of the polymer [A2] is within the above specific range, warping of the substrate can be further suppressed.

Method for Synthesizing Polymer [A2]

The polymer [A2] may be synthesized in the same manner as the polymer [A1].

The Mw of the polymer [A2] is not particularly limited, but is preferably 1000 to 50,000, and more preferably 2000 to 40,000. If the Mw of the polymer [A2] is less than 1000, the resist underlayer film-forming composition may exhibit a deterioration in film-forming capability when forming a resist underlayer film. If the Mw of the polymer [A2] exceeds 50,000, the resulting resist underlayer film may exhibit insufficient adhesion.

Acid Generator [B]

The resist underlayer film-forming composition preferably includes the acid generator [B]. The acid generator [B] is a component that generates an acid upon exposure or heating. When the resist underlayer film-forming composition includes the acid generator [B], a crosslinking reaction of the polymer [A1] is promoted, for example. The acid generator [B] may be included in the resist underlayer film-forming composition as a compound (described below), and/or may be included in the polymer.

Examples of the acid generator [B] include onium salt compounds, N-sulfonyloxyimide compounds, and the like. It is preferable to use an onium salt compound as the acid generator [B].

Examples of the onium salt compounds include sulfonium salts, tetrahydrothiophenium salts, iodonium salts, and the like.

Examples of the sulfonium salts include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, triphenylsulfonium 1,1,2,2-tetrafluoro-6-(1-adamantanecarbonyloxy)hexane-1-sulfonate, and the like. Among these, triphenylsulfonium trifluoromethanesulfonate, triphenylsulfonium nonafluoro-n-butanesulfonate, and triphenylsulfonium 1,1,2,2-tetrafluoro-6-(1-adamantanecarbonyloxy)hexane-1-sulfonate are preferable.

Examples of the tetrahydrothiophenium salts include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, and the like. Among these, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, and 1-(3,5-dimethyl-4-hydroxyphenyl)tetrahydrothiophenium nonafluoro-n-butanesulfonate are preferable.

Examples of the iodonium salts include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, and the like. Among these, bis(4-t-butylphenyl)iodonium nonafluoro-n-butanesulfonate is preferable.

Examples of the N-sulfonyloxyimide compounds include N-(trifluoromethanesulfonyloxy)bicyclo[2.2.1]hept-5-ene-2,3-dicarboxylmide, N-(nonafluoro-n-butanesulfonyloxy)bicyclo[2.2.1]hept-5-ene-2,3-dicarboxylmide, N-(perfluoro-n-octanesulfonyloxy)bicyclo[2.2.1]hept-5-ene-2,3-dicarboxylmide, N-(2-bicyclo[2.2.1]hept-2-yl-1,1,2,2-tetrafluoroethanesulfonyloxy)bicyclo[2.2.1]hept-5-ene-2,3-dicarboxylmide, and the like. Among these, N-(trifluoromethanesulfonyloxy)bicyclo[2.2.1]hept-5-ene-2,3-dicarboxylmide is preferable.

These acid generators [B] may be used either alone or in combination. The acid generator [B] is preferably used in an amount of 0.1 to 15 parts by mass, and more preferably 1 to 10 parts by mass, based on 100 parts by mass of the polymer [A1].

Crosslinking Agent [C]

The resist underlayer film-forming composition preferably further includes the crosslinking agent [C]. When the resist underlayer film-forming composition further includes the crosslinking agent [C], a crosslinking reaction of the polymer [A1] and the polymer [A2] is further promoted. Examples of the crosslinking agent [C] include an epoxy resin that includes a fused polycyclic skeleton, an epoxy resin that includes a biphenyl skeleton, an epoxy resin that includes an oxazolidone ring skeleton, an amine-type epoxy resin, a compound that includes an alkoxymethylated amino group, and the like. The term "fused polycyclic skeleton" used herein refers to a cyclic hydrocarbon skeleton or a heteroatom-containing cyclic compound skeleton that is formed by two or more monocyclic rings that share an arbitrary side thereof. The monocyclic ring may be a ring that includes a saturated bond, or may be a ring that includes an unsaturated bond. The unsaturated bond is selected from a carbon-carbon double bond, a carbon-nitrogen double bond, and a carbon-carbon triple bond. Examples of the fused polycyclic skeleton include a naphthalene skeleton, a fluorene skeleton, a dicyclopentadiene skeleton, an anthracene skeleton, and the like.

Examples of a commercially available product of an epoxy resin that includes a naphthalene skeleton include Epiclon (registered trademark) HP4032, Epiclon (registered trademark) HP4032D, Epiclon (registered trademark) HP4700, and Epiclon (registered trademark) HP4770 (manufactured by DIC Corporation); NC-7000 and NC-7300 (manufactured by Nippon Kayaku Co., Ltd.); ESN-175 and ESN-360 (manufactured by NSCC Epoxy Manufacturing Co., Ltd.); and the like.

Examples of a commercially available product of an epoxy resin that includes a fluorene skeleton include Oncoat (registered trademark) EX-1010, Oncoat (registered trademark) EX-1011, Oncoat (registered trademark) EX-1012, Oncoat (registered trademark) EX-1020, Oncoat (registered trademark) EX-1030, Oncoat (registered trademark) EX-1040, Oncoat (registered trademark) EX-1050, and Oncoat (registered trademark) EX-1051 (manufactured by Nagase & Co., Ltd.); and the like.

Examples of a commercially available product of an epoxy resin that includes a dicyclopentadiene skeleton include Epiclon (registered trademark) HP7200, Epiclon (registered trademark) HP7200L, and Epiclon (registered trademark) HP7200H (manufactured by DIC Corporation); Tactix 558 (manufactured by Huntsman Advanced Materials); XD-1000-1L and XD-1000-2L (manufactured by Nippon Kayaku Co., Ltd.); and the like.

Examples of a commercially available product of an epoxy resin that includes an anthracene skeleton include jER (registered trademark) YX8800 (manufactured by Japan Epoxy Resins Co., Ltd.); and the like.

Examples of a commercially available product of an epoxy resin that includes a biphenyl skeleton include jER (registered trademark) YX4000H, jER (registered trademark) YX4000, jER (registered trademark) YL6616, jER (registered trademark) YL6121H, and jER (registered trademark) YL6640 (manufactured by Japan Epoxy Resins Co., Ltd.); NC3000 (manufactured by Nippon Kayaku Co., Ltd.); and the like.

Examples of a commercially available product of an epoxy resin that includes an oxazolidone ring skeleton include AER4152 and XAC4151 (manufactured by Asahi Kasei Epoxy Co., Ltd.); and the like. Note that the epoxy resin that includes an oxazolidone ring skeleton may be obtained by the method disclosed in Japanese Patent Application Publication (KOKAI) No. 2003-119253 (i.e., a method that reacts an epoxy resin and an isocyanate compound in the presence of a catalyst), for example.

Among these, an epoxy resin that includes an oxazolidone ring skeleton and an epoxy resin that includes a naphthalene skeleton are preferable since these epoxy resins have a modulus of elasticity and toughness in a well-balanced manner.

Examples of the amine-type epoxy resin include tetraglycidyldiaminodiphenylmethane, triglycidylaminophenol, triglycidylaminocresol, diglycidylaniline, diglycidyltoluidine, tetraglycidylxylylenediamine, halogen-substituted products, alkyl-substituted products, alkoxy-substituted products, aryl-substituted products, aryloxy-substituted products, and hydrogenated products thereof, and the like.

Examples of a commercially available product of tetraglycidyldiaminodiphenylmethane include Sumiepoxy (registered trademark) ELM434 (manufactured by Sumitomo Chemical Co., Ltd.); YH434L (manufactured by NSCC Epoxy Manufacturing Co., Ltd.); jER (registered trademark) 604 (manufactured by Japan Epoxy Resins Co., Ltd.); Araldite (registered trademark) MY720 and Araldite (registered trademark) MY721 (manufactured by Huntsman Advanced Materials); and the like.

Examples of a commercially available product of triglycidylaminophenol or triglycidylaminocresol include Sumiepoxy (registered trademark) ELM100 and Sumiepoxy (registered trademark) ELM120 (manufactured by Sumitomo Chemical Co., Ltd.); Araldite (registered trademark) MY0500, Araldite (registered trademark) MY0510, and Araldite (registered trademark) MY0600 (manufactured by Huntsman Advanced Materials); jER (registered trademark) 630 (manufactured by Japan Epoxy Resins Co., Ltd.); and the like.

Examples of a commercially available product of diglycidylaniline include GAN (manufactured by Nippon Kayaku Co., Ltd.); and the like.

Examples of a commercially available product of diglycidyltoluidine include GOT (manufactured by Nippon Kayaku Co., Ltd.); and the like.

Examples of a commercially available product of tetraglycidylxylylenediamine and a hydrogenated product thereof include TETRAD (registered trademark)-X and TETRAD (registered trademark)-C (manufactured by Mitsubishi Gas Chemical Company, Inc.); and the like.

Examples of the compound that includes an alkoxymethylated amino group include melamine compounds such as hexamethoxymethylmelamine and hexabutoxymethylmelamine, glycoluril compounds such as tetramethoxymethylglycoluril and tetrabutoxyglycoluril, and the like.

It is preferable to use a compound that includes an alkoxymethylated amino group since such a compound provides the resulting resist underlayer film with high toughness and an improved balance between the modulus of elasticity and the plastic deformability.

Further examples of the crosslinking agent include a phenol novolac-type epoxy resin, a cresol novolac-type epoxy resin, a resorcinol-type epoxy resin, a phenol aralkyl-type epoxy resin, a triphenylmethane-type epoxy resin, a tetraphenylethane-type epoxy resin, and the like.

Examples of a commercially available product of the phenol novolac-type epoxy resin include jER (registered trademark) 152 and jER (registered trademark) 154 (manufactured by Japan Epoxy Resins Co., Ltd.); Epiclon (registered trademark) N-740, Epiclon (registered trademark) N-770, and Epiclon (registered trademark) N-775 (manufactured by DIC Corporation); and the like.

Examples of a commercially available product of the cresol novolac-type epoxy resin include Epiclon (registered trademark) N-660, Epiclon (registered trademark) N-665, Epiclon (registered trademark) N-670, Epiclon (registered trademark) N-673, and Epiclon (registered trademark) N-695 (manufactured by DIC Corporation); EOCN-1020, EOCN-102S, and EOCN-104S (manufactured by Nippon Kayaku Co., Ltd.); and the like.

Examples of a commercially available product of the resorcinol-type epoxy resin include Denacol (registered trademark) EX-201 (manufactured by Nagase ChemteX Corporation); and the like.

Examples of a commercially available product of the triphenylmethane-type epoxy resin include Tactix 742 (manufactured by Huntsman Advanced Materials); EPPN-501H and EPPN-502H (manufactured by Nippon Kayaku Co., Ltd.); and the like.

Examples of a commercially available product of the tetraphenylethane-type epoxy resin include jER (registered trademark) 1031 S (manufactured by Japan Epoxy Resins Co., Ltd.); and the like.

These crosslinking agents [C] may be used either alone or in combination. The crosslinking agent [C] is preferably used in an amount of 0.1 to 10 parts by mass, and more preferably 0.5 to 5 parts by mass, based on 100 parts by mass of the polymer [A1].

Solvent

The resist underlayer film-forming composition normally includes a solvent. The solvent is not particularly limited as long as the solvent can dissolve or disperse each component. Examples of the solvent include alcohol-based solvents, ketone-based solvents, amide-based solvents, ether-based solvents, ester-based solvents, hydrocarbon-based solvents, and the like. These solvents may be used either alone or in combination.

Examples of the alcohol-based solvents include monohydric alcohol-based solvents having 1 to 18 carbon atoms, polyhydric alcohol-based solvents having 2 to 18 carbon atoms, polyhydric alcohol partial ether-based solvents having 3 to 19 carbon atoms, and the like.

Examples of the ether-based solvents include dialkyl ether solvents such as diethyl ether, dipropyl ether, and dibutyl ether; cyclic ether-based solvents such as tetrahydrofuran and tetrahydropyran; aromatic ring-containing ether-based solvents such as diphenyl ether and anisole; and the like.

Examples of the ketone-based solvents include chain-like ketone-based solvents such as acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, diisobutyl ketone, and trimethylenonane; cyclic ketone-based solvents such as cyclopentanone, cyclohexanone, cycloheptanone, cyclooctanone, and methylcyclohexanone; 2,4-pentanedione; acetonylacetone; acetophenone; and the like.

Examples of the amide-based solvents include cyclic amide-based solvents such as N,N'-dimethylimidazolidinone and N-methylpyrrolidone; chain-like amide-based solvents such as N-methylformamide, N,N-dimethylformamide, N,N-dimethylformamide, acetamide, N-methylacetamide, N,N-dimethylacetamide, and N-methylpropionamide; and the like.

Examples of the ester-based solvents include carboxylate-based solvents such as monocarboxylate-based solvents such as ethyl acetate and ethyl lactate, and polycarboxylate-based solvents such as diethyl malonate and diethyl phthalate; polyhydric alcohol partial ether carboxylate-based solvents such as polyhydric alcohol partial ether acetate-based solvents such as propylene glycol monomethyl ether acetate; lactone-based solvents such as butyrolactone and valerolactone; carbonate-based solvents such as diethyl carbonate, ethylene carbonate, and propylene carbonate; and the like.

Examples of the hydrocarbon-based solvents include aliphatic hydrocarbon-based solvents having 5 to 12 carbon atoms, aromatic hydrocarbon-based solvents having 6 to 16 carbon atoms, and the like.

Further examples of the solvent include halogen-containing solvents such as dichloromethane, chloroform, fluorocarbon, chlorobenzene, and dichlorobenzene; and the like.

Among these, an ester-based solvent and a ketone-based solvent are preferable, a polyhydric alcohol partial ether carboxylate-based solvent, a carboxylate-based solvent, and a ketone-based solvent are more preferable, and a polyhydric alcohol partial ether acetate-based solvent, a monocarboxylate-based solvent, and a cyclic ketone-based solvent are still more preferable. Specific examples of a particularly preferable solvent include propylene glycol monomethyl ether acetate, propylene glycol monomethyl ether, ethyl 3-ethoxypropionate, methyl 3-methoxypropionate, ethyl lactate, cyclohexanone, and the like.

Additional Optional Component

The resist underlayer film-forming composition may include an additional optional component such as a surfactant and a promoter as long as the advantageous effects of the invention are not impaired. Each additional optional component is described in detail below. Each additional optional component may respectively be used either alone or in combination. Each additional optional component may respectively be used in an appropriate amount depending on the objective.

Surfactant

The surfactant improves the applicability of the resist underlayer film-forming composition, striation, and the like. Examples of the surfactant include nonionic surfactants such as polyoxyethylene lauryl ether, polyoxyethylene stearyl ether, polyoxyethylene oleyl ether, polyoxyethylene n-octyl phenyl ether, polyoxyethylene n-nonyl phenyl ether, polyethylene glycol dilaurate, and polyethylene glycol distearate; and the like. Examples of a commercially available product of the surfactant include KP341 (manufactured by Shin-Etsu Chemical Co., Ltd.); Polyflow No. 75 and Polyflow No. 95 (manufactured by Kyoeisha Chemical Co., Ltd.); EFTOP EF301, EFTOP EF303, and EFTOP EF352 (manufactured by JEMCO, Inc.); Megafac F171 and Megafac F173 (manufactured by DIC Corporation); Fluorad FC430 and Fluorad FC431 (manufactured by Sumitomo 3M Ltd.); Asahi Guard AG710, Surflon S-382, Surflon SC-101, Surflon SC-102, Surflon SC-103, Surflon SC-104, Surflon SC-105, and Surflon SC-106 (manufactured by Asahi Glass Co., Ltd.); and the like.

Promoter

The promoter is a one-electron oxidizing agent that causes a sufficient dehydrogenation reaction necessary for oxidative crosslinking, for example. The term "one-electron oxidizing agent" refers to an oxidizing agent that undergoes a one-electron transfer reaction. For example, ammonium cerium(IV) nitrate undergoes a one-electron transfer reaction in which a cerium(IV) ion is converted into a cerium (III) ion upon acquisition of one electron. A radical oxidizing agent (e.g., halogen) is converted into an anion upon acquisition of one electron. A phenomenon in which the oxidation target substance (e.g., substrate or catalyst) is oxidized due to removal of one electron from the oxidation target substance is referred to as "one-electron oxidation", and a component that receives one electron is referred to as "one-electron oxidizing agent".

Examples of the one-electron oxidizing agent include metal compounds, peroxides, diazo compounds, halogen atoms, halogen acids, and the like.

Examples of the metal compounds include metal compounds that include cerium, lead, silver, manganese, osmium, ruthenium, vanadium, thallium, copper, iron, bismuth, or nickel, and the like. Specific examples of the metal compounds include cerium salts such as ammonium cerium (IV) nitrate, cerium(IV) acetate, cerium(IV) nitrate, and cerium(IV) sulfate; lead compounds such as lead tetraacetate and lead(IV) oxide; silver compounds such as silver(I) oxide, silver(II) oxide, and silver carbonate (Fetizon reagent); manganese compounds such as a permanganate, active manganese dioxide, and a manganese(III) salt; osmium compounds such as osmium tetroxide; ruthenium compounds such as ruthenium tetroxide; vanadium compounds such as $VOCl_3$, $VOF_3$, $V_2O_5$, $NH_4VO_3$, and $NaVO_3$; thallium compounds such as thallium(III) acetate, thallium (III)trifluoroacetate, and thallium(III) nitrate; copper compounds such as copper(II) acetate, copper(II)trifluoromethanesulfonate, copper(II)trifluoroborate, copper(II) chloride, and copper(I) acetate; iron compounds such as iron(III) chloride and potassium hexacyanoferrate(III); bismuth compounds such as sodium bismuthate; nickel compounds such as nickel peroxide; and the like.

Examples of the peroxides include peroxy acids such as peracetic acid and m-chloroperbenzoic acid, hydroxy peroxides such as hydrogen peroxide and an alkylhydroxy peroxide (e.g., t-butyl hydroperoxide), diacyl peroxides, peracid esters, peracid ketals, peroxy dicarbonates, dialkyl peroxides, peracid ketones, and the like.

Examples of the diazo compounds include 2,2'-azobisisobutyronitrile and the like.

Examples of the halogen atoms or the halogen acids include halogen atoms such as chlorine, bromine, and iodine, perhalogen acids, halogen acids, halous acids, hypohalous acids, salts thereof, and the like.

Among these, the peroxides and the diazo compounds are preferable, and m-chloroperbenzoic acid, t-butyl hydroperoxide, and 2,2'-azobisisobutyronitrile are more preferable, since a metal residue or the like rarely adheres to the substrate.

Preparation of Resist Underlayer Film-forming Composition

The resist underlayer film-forming composition may be prepared by mixing the polymer [A1], the optional polymer [A2], the acid generator [B], the crosslinking agent [C], and an additional optional component in the solvent in a given ratio, for example. The solvent is not particularly limited as long as the solvent can dissolve or disperse the polymer [A1], the optional polymer [A2], the acid generator [B], the crosslinking agent [C], and an additional optional component. A solution prepared by dissolving the components in the solvent is normally filtered through a filter having a pore size of about 0.1 μm, for example.

Method for Preparing Resist Underlayer Film-forming Composition

The resist underlayer film-forming composition (II) that includes the polymer [A1] and the polymer [A2] may be prepared by mixing the polymer [A1] and the polymer [A2] in the solvent in a given ratio optionally together with the acid generator [B], the crosslinking agent [C], and an additional optional component, for example. According to this method, it is possible to easily prepare a resist underlayer film-forming composition that can suppress warping of a substrate, and can produce a resist underlayer film that exhibits improved etching resistance.

Pattern-forming Method

The pattern-forming method includes:
(1) forming a resist underlayer film on a substrate using the resist underlayer film-forming composition (hereinafter may be referred to as "step (1)");
(2) forming a silicon-based oxide film on the surface of the resist underlayer film (hereinafter may be referred to as "step (2)");
(3) applying a resist composition to the surface of the silicon-based oxide film, followed by exposure, heating, and development to form a resist pattern (hereinafter may be referred to as "step (3)");
(4) sequentially dry-etching the silicon-based oxide film and the resist underlayer film using the resist pattern as a mask (hereinafter may be referred to as "step (4)"); and
(5) dry-etching the substrate using the resist underlayer film dry-etched in the step (4) as a mask (hereinafter may be referred to as "step (5)"). Each step is described in detail below.

Step (1)

In the step (1), the resist underlayer film is formed on the substrate using the resist underlayer film-forming composition. Examples of the substrate include a wafer coated with an insulating film (e.g., silicon oxide, silicon nitride, silicon oxynitride, or polysiloxane) or a low-dielectric-constant insulating film (e.g., Black Diamond (manufactured by AMAT), SiLK (manufactured by Dow Chemical), or LKD5109 (manufactured by JSR Corporation)), and the like. A patterned substrate having a trench, a via, and the like may also be used as the substrate. The resist underlayer film may be formed by applying the resist underlayer film-forming composition to the surface of the substrate, another underlayer film (antireflective film), or the like to form a film, and curing the film by heating the film, or curing the film by applying ultraviolet rays to the film while heating the film, for example. The resist underlayer film-forming composition may be applied by spin coating, roll coating, dip coating, or the like. The heating temperature is normally 150 to 500° C., and preferably 180 to 350° C. The heating time is normally 30 to 1200 seconds, and preferably 45 to 600 seconds. Since the resist underlayer film-forming composition includes the polymer [A1] having a glass transition temperature (Tg) of 0 to 180° C., even when a resist underlayer film having a relatively large thickness is formed using the resist underlayer film-forming composition, it is possible to reduce a residual stress in the resist underlayer film due to heating, and suppress warping of the substrate. It is also possible to form a resist underlayer film that exhibits excellent etching resistance and excellent crack resistance.

Step (2)

In the step (2), the silicon-based oxide film is formed on the surface of the resist underlayer film. Examples of a silicon-based oxide film-forming composition include NFC SOG508 (manufactured by JSR Corporation) and the like.

The silicon-based oxide film may be formed using an arbitrary method. For example, the silicon-based oxide film may be formed by spin coating, an application method, CVD, or the like. The heating temperature is normally 150 to 500° C., and preferably 180 to 350° C. The heating time is normally 30 to 1200 seconds, and preferably 45 to 600 seconds. The thickness of the silicon-based oxide film is normally 0.01 to 0.3 μm, and preferably 0.02 to 0.1 μm.

Step (3)

In the step (3), the resist composition is applied to the silicon-based oxide film, and the resulting resist film is exposed, heated, and developed to form a resist pattern. Examples of the resist composition include a positive-tone or negative-tone chemically-amplified resist composition that includes a photoacid generator, a positive-tone resist composition that includes an alkali-soluble resin and a quinondiazide-based photosensitizer, a negative-tone resist composition that includes an alkali-soluble resin and a crosslinking agent, and the like. A commercially available resist composition may be used as the resist composition used for the pattern-forming method. The resist composition may be applied by spin coating or the like. The amount of the resist composition applied is adjusted so that the resulting resist film has the desired thickness. The resist pattern may be formed using a nanoimprint method, or may be formed using a self-assembly process, for example.

The resist film may be formed by volatilizing a solvent (i.e., a solvent included in the resist composition) from the film by prebaking the film formed by applying the resist composition. The prebaking temperature is appropriately selected depending on the type of the resist composition and the like. The prebaking temperature is preferably 30 to 200° C., and more preferably 50 to 150° C. The prebaking time is normally 30 to 200 seconds, and preferably 45 to 120 seconds. Note that an additional film may be formed on the surface of the resist film. The thickness of the resist film is normally 0.01 to 0.5 μm, and preferably 0.02 to 0.3 μm.

The resist film is exposed by selectively applying radiation to the resist film via a photomask. Radiation used for exposure is appropriately selected from visible rays, ultraviolet rays, deep ultraviolet rays, X-rays, electron beams, γ-rays, molecular beams, ion beams, and the like depending on the type of the acid generator included in the resist composition. It is preferable to use deep ultraviolet rays. It is more preferable to use KrF excimer laser light (wavelength: 248 nm), ArF excimer laser light (wavelength: 193 nm), $F_2$ excimer laser light (wavelength: 157 nm), $Kr_2$ excimer laser light (wavelength: 147 nm), ArKr excimer laser light (wavelength: 134 nm), or EUV light (wavelength: 13 nm, for example). Liquid immersion lithography may also be employed.

The exposed resist film is subjected to post-exposure bake in order to improve the resolution, the pattern profile, the developability, and the like. The post-exposure bake temperature is appropriately adjusted depending on the type of the resist composition and the like, but is normally about 30 to about 200° C., and preferably 50 to 150° C.

The resist film is then developed to form a resist pattern. A developer used for development may be appropriately selected depending on the type of the resist composition. When the resist composition is a positive-tone chemically-amplified resist composition or a positive-tone resist composition that includes an alkali-soluble resin, an alkaline aqueous solution of sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo[5.4.0]-7-undecene, 1,5-diazabicyclo[4.3.0]-5-nonene, or the like may be used as the developer. An appropriate amount of a water-soluble organic solvent, an alcohol (e.g., methanol or ethanol), or a surfactant may be added to the alkaline aqueous solution.

When the resist composition is a negative-tone chemically-amplified resist composition or a negative-tone resist composition that includes an alkali-soluble resin, an aqueous solution prepared by dissolving an alkali (e.g., inorganic alkalis such as sodium hydroxide, potassium hydroxide, sodium carbonate, sodium silicate, sodium metasilicate, and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide, tetraethylammonium hydroxide, and choline, and cyclic amines such as pyrrole and piperidine) in water may be used as the developer.

Step (4)

In the step (4), the silicon-based oxide film and the resist underlayer film are sequentially dry-etched using the resist pattern as a mask. The dry etching process may be performed using a known dry etching system. An oxygen-containing gas (e.g., $O_2$, CO, or $CO_2$), an inert gas (e.g., He, $N_2$, or Ar), a chlorine-based gas (e.g., $Cl_2$ or $BCl_4$), a fluorine-based gas (e.g., $CHF_3$ or $CF_4$), $H_2$, $NH_3$, or the like may be used as a source gas used for dry etching depending on the elemental composition of the etching target. Note that these gases may be used in combination.

When the silicon-based oxide film is formed on the surface of the resist underlayer film using a multilayer resist process, the step (4) may include etching the remaining silicon-based oxide film. Examples of the etching method include a dry etching method, a wet etching method, and the like. It is preferable to use a dry etching method. The dry etching process may be performed using a known dry etching system. A chlorine-based gas (e.g., $Cl_2$ or $BCl_4$), a fluorine-based gas (e.g., $CHF_3$ or $CF_4$), $H_2$, $NH_3$, or the like may be used as a source gas used for dry etching. Note that these gases may be used in combination. A wet etching process may be performed using a hydrogen fluoride aqueous solution, a hydrofluoric acid-based buffer solution, or the like. Examples of the hydrofluoric acid-based buffer solution include a mixed solution of a hydrogen fluoride aqueous solution and ammonium fluoride (weak alkali).

Step (5)

In the step (5), the substrate is dry-etched using the resist underlayer film that has been etched in the step (4) as a mask. The dry etching process may be performed using a known dry etching system. Examples of a source gas used for dry etching include those mentioned above in connection with the step (4).

The pattern-forming method may further include a step that removes the resist underlayer film that remains on the substrate.

In this case, the resist underlayer film is removed by plasma ashing. The term "plasma ashing" used herein refers to generating plasma of a reactive gas (e.g., oxygen) in a gas phase, and decomposing the resist underlayer film (organic substance) into $CO_N$, $H_2O$, and the like by utilizing the plasma to remove the resist underlayer film.

The plasma ashing conditions are not particularly limited as long as the resist underlayer film can be removed. For example, high-frequency power applied to the susceptor is preferably 100 to 1000 W, and more preferably 100 to 500 W. The temperature of the susceptor is preferably 20 to 100° C., and more preferably 20 to 60° C. The pressure inside the processing chamber is preferably 1 to 300 mtorr, and more preferably 30 to 100 mtorr.

The gas used for plasma ashing is not particularly limited as long as the resist underlayer film can be removed. It is preferable to use a gas that includes at least one element selected from the group consisting of nitrogen, hydrogen, ammonia, and argon, and it is more preferable to use a mixed gas of nitrogen and hydrogen, a mixed gas of ammonia and argon, or a mixed gas of ammonia, nitrogen, and hydrogen, from the viewpoint of suppressing an increase in the relative dielectric constant of the substrate due to plasma ashing.

When using a mixed gas of nitrogen and hydrogen, it is preferable to use hydrogen in a volume ratio of 20, and more preferably 1 to 10, with respect to nitrogen (=100). When using a mixed gas of ammonia and argon, it is preferable to use argon in a volume ratio of 10 or less with respect to ammonia (=100).

Resist Underlayer Film

A resist underlayer film that is formed using the resist underlayer film-forming composition is also included within the scope of the invention. Since the resist underlayer film is formed using the resist underlayer film-forming composition, the resist underlayer film exhibits excellent etching resistance and excellent crack resistance while suppressing warping of a substrate.

It is preferable that the resist underlayer film have a static contact angle with water of 70° or more. When the resist underlayer film has a static contact angle with water of 70° or more (i.e., the resist underlayer film exhibits high hydrophobicity), it is possible to reduce external stimulation due to an aqueous solution during wet etching or the like performed after forming the resist film, for example. This makes it possible to further suppress a situation in which the pattern formed by the resist underlayer film collapses.

EXAMPLES

The invention is further described below by way of examples. Note that the invention is not limited to the following examples.

The glass transition temperature (Tg) of the polymer [A1] and the polymer [A2] included in the resist underlayer film-forming compositions used in the examples and comparative example was measured using a differential scanning calorimeter ("DSC204 F1" manufactured by NETZSCH). Note that a case where the glass transition temperature (Tg) was not observed even when the temperature was increased to 200° C. is indicated by ">200° C.".

Synthesis of Polymer [A1]

Synthesis Example 1

A separable flask equipped with a thermometer was charged with 70 parts by mass of 2-vinylnaphthalene that produces the structural unit (II), 30 parts by mass of vinylbenzyl alcohol that produces the structural unit (III), 300 parts by mass of methyl ethyl ketone, and 5 parts by mass of dimethyl 2,2-azobis(isobutyrate) in a nitrogen atmosphere. The mixture was stirred at 80° C. for 6 hours. The reaction solution was poured into a large quantity of methanol, and a precipitate (polymer) was filtered off to obtain a polymer (A1-1). The polymer (A1-1) had an Mw of 13,000 and a glass transition temperature (Tg) of 120° C.

Synthesis Example 2

A separable flask equipped with a thermometer was charged with 50 parts by mass of 2-vinylnaphthalene that produces the structural unit (II), 30 parts by mass of vinylbenzyl alcohol that produces the structural unit (III), 20 parts by mass of acenaphthylene, 300 parts by mass of methyl ethyl ketone, and 5 parts by mass of dimethyl 2,2-azobis (isobutyrate) in a nitrogen atmosphere. The mixture was stirred at 80° C. for 6 hours. The reaction solution was poured into a large quantity of methanol, and a precipitate (polymer) was filtered off to obtain a polymer (A1-2). The polymer (A1-2) had an Mw of 6000 and a glass transition temperature (Tg) of 140° C.

Synthesis Example 3

A separable flask equipped with a thermometer was charged with 50 parts by mass of 2-vinylnaphthalene that produces the structural unit (II), 50 parts by mass of 5-hydroxymethylacenaphthylene, 300 parts by mass of cyclohexanone, and 5 parts by mass of dimethyl 2,2-azobis (isobutyrate) in a nitrogen atmosphere. The mixture was stirred at 80° C. for 6 hours. The reaction solution was poured into a large quantity of methanol, and a precipitate (polymer) was filtered off to obtain a polymer (A1-3). The polymer (A1-3) had an Mw of 30,000 and a glass transition temperature (Tg) of 150° C.

Synthesis Example 4

A reactor equipped with a condenser, a thermometer, and a stirrer was charged with 100 parts by mass of phenol, 100 parts by mass of propylene glycol monomethyl ether acetate, and 50 parts by mass of paraformaldehyde. After the addition of 2 parts by mass of oxalic acid, the mixture was heated to 120° C. while dehydrating the mixture, and reacted for 5 hours to obtain a polymer (A1-4) including the structural unit (IV) represented by the following formula. The polymer (A1-4) had an Mw of 7000 and a glass transition temperature (Tg) of 90° C.

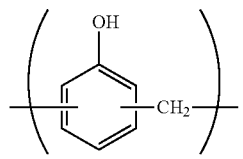

Synthesis Example 5

A separable flask equipped with a thermometer was charged with 15 parts by mass of n-butyl acrylate that produces the structural unit (I), 50 parts by mass of 2-vinylnaphthalene that produces the structural unit (II), 35 parts by mass of vinylbenzyl alcohol that produces the structural unit (III), 300 parts by mass of methyl ethyl ketone, and 5 parts by mass of dimethyl 2,2-azobis(isobutyrate) in a nitrogen atmosphere. The mixture was stirred at 80° C. for 6 hours. The reaction solution was poured into a large quantity of n-heptane, and a precipitate (polymer) was filtered off to obtain a polymer (A1-5). The polymer (A1-5) had an Mw of 5000 and a glass transition temperature (Tg) of 75° C.

Synthesis of Polymer [A2]

Synthesis Example 6

A separable flask equipped with a thermometer was charged with 100 parts by mass of acenaphthylene, 78 parts by mass of toluene, 52 parts by mass of dioxane, and 3 parts by mass of 2,2-azobisisobutyronitrile in a nitrogen atmosphere. The mixture was stirred at 70° C. for 5 hours to obtain a polymer having an Mw of 10,000. After the addition of 5.2 parts by mass of p-toluenesulfonic acid monohydrate and 40 parts of paraformaldehyde, the mixture was heated to 120° C., and stirred for 6 hours. The reaction solution was poured into a large quantity of isopropanol, and a precipitate (polymer) was filtered off to obtain a polymer (A2-1). The polymer (A2-1) had an Mw of 20,000 and a glass transition temperature (Tg) of >200° C.

Synthesis Example 7

A reactor equipped with a condenser, a thermometer, and a stirrer was charged with 100 parts by mass of 2,7-dihydroxynaphthalene, 100 parts by mass of propylene glycol monomethyl ether acetate, and 50 parts by mass of paraformaldehyde. After the addition of 2 parts by mass of oxalic acid, the mixture was heated to 120° C. while dehydrating the mixture, and reacted for 5 hours to obtain a polymer (A2-2) including the structural unit represented by the following formula. The polymer (A2-2) had an Mw of 3000 and a glass transition temperature (Tg) of >200° C.

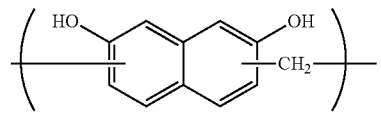

Synthesis Example 8

6.25 g of m-diethynylbenzene that produces the structural unit (VII) and 10.13 g of phenylacetylene were dissolved in 200 mL of pyridine, and 6.3 g of copper(I) chloride was added to the solution at room temperature with stirring. After stirring the reaction solution for 1 hour, the product was reprecipitated in a large quantity of a water/isopropyl alcohol (mass ratio=1:1) solution. The product was washed with water, and dissolved in toluene. The solution was washed twice with 3 mass % oxalic acid, washed twice with water, concentrated under vacuum, and solidified to obtain a polymer (A2-3). The polymer (A2-3) had an Mw of 1000 and a glass transition temperature (Tg) of >200° C.

Synthesis Example 9

A separable flask equipped with a thermometer was charged with 60 parts by mass of acenaphthylene that produces the structural unit (V), 40 parts by mass of vinylbenzyl alcohol that produces the structural unit (III), 450 parts by mass of methyl ethyl ketone, and 5 parts by mass of 2,2-azobisisobutyronitrile in a nitrogen atmosphere. The mixture was stirred at 70° C. for 5 hours. The reaction solution was poured into a large quantity of isopropanol, and a precipitate (polymer) was filtered off to obtain a polymer (A2-4). The polymer (A2-4) had an Mw of 10,000 and a glass transition temperature (Tg) of >200° C.

Synthesis Example 10

A separable flask equipped with a thermometer was charged with 10 parts by mass of 1-naphthol that produces the structural unit (VI), 10 parts by mass of formaldehyde, 1 part by mass of p-toluenesulfonic acid, and 30 parts by mass of methyl isobutyl ketone. The mixture was reacted at 50° C. for 5 hours with stirring to obtain a 1-naphthol/formaldehyde condensate. A separable flask equipped with a thermometer was charged with 50 parts by mass of the 1-naphthol/formaldehyde condensate, 40 parts by mass of propargyl bromide, 15 parts by mass of diazabicycloundecene, and 15 parts by mass of N-methylpyrrolidone. The mixture was reacted at 50° C. for 5 hours. After completion of the reaction, the reaction solution was cooled with water to 30° C. or less. The cooled reaction solution was added to a large quantity of n-heptane. A precipitate (polymer) was filtered off to obtain a polymer (A2-5). The polymer (A2-5) had an Mw of 4000 and a glass transition temperature (Tg) of >200° C.

Synthesis Example 11

A flask equipped with a calcium chloride tube was charged with 0.46 g of di-μ-hydroxobis[(N,N,N',N'-tetramethylethylenediamine)copper(II)] chloride and 138 g of methanol, and the mixture was stirred for 15 minutes. After the addition of 3.20 g of 2,3-dihydroxynaphthalene that produces the structural unit (VI), the mixture was stirred for 8 hours. After the addition of a 1 M hydrochloric acid aqueous solution, the mixture was stirred. A precipitate was collected, washed with water, and dried at 50° C. for 17 hours to obtain a polymer (A2-6). The polymer (A2-6) had an Mw of 6000 and a glass transition temperature (Tg) of >200° C.

Preparation of Resist Underlayer Film-forming Composition

Preparation of Resist Underlayer Film-forming Composition (I)

Example 1

20 parts by mass of the polymer (A1-1) (polymer [A1]), 0.6 parts by mass of diphenyliodonium trifluoromethanesulfonate (hereinafter referred to as "B-1") (thermal acid generator) (acid generator [B]), and 2 parts by mass of 1,3,4,6-tetrakis(methoxymethyl)glycoluril represented by the following formula (hereinafter referred to as "C-1") (crosslinking agent [C]) were dissolved in 77.4 parts by mass of propylene glycol monomethyl ether acetate (hereinafter referred to as "D-1") (solvent). The solution was filtered through a membrane filter having a pore size of 0.1 μm to prepare a resist underlayer film-forming composition.

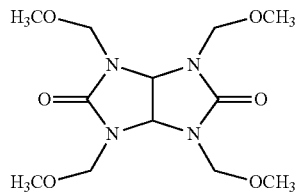 [SMILES: COCN1C(=O)N(COC)C2C1N(COC)C(=O)N2COC]

Examples 2 and 3 and Comparative Examples 1 and 2

A resist underlayer film-forming composition was prepared in the same manner as in Example 1, except that the type and the amount of each component were changed as shown in Table 1. Note that the solvent (D-2) in Table 1 refers to cyclohexanone. The symbol "-" in Table 1 indicates that the corresponding component was not used.

Evaluation

A resist underlayer film was formed using the resist underlayer film-forming composition, and the following properties were evaluated as described below. The results are shown in Table 1.

Static Contact Angle (°)

The resist underlayer film-forming composition was spin-coated onto an 8-inch silicon wafer, heated at 180° C. for 60 seconds on a hot plate (oxygen concentration: 20 vol %), and heated at 300° C. for 60 seconds to form a resist underlayer film having a thickness of 0.1 μm. The static contact angle)(° formed by the resist underlayer film and water was measured using a contact angle meter ("DLA10L2E" manufactured by KRUS).

Etching Resistance (nm/min)

The resist underlayer film-forming composition was spin-coated onto an 8-inch silicon wafer, heated at 180° C. for 60 seconds on a hot plate (oxygen concentration: 20 vol %), and heated at 300° C. for 60 seconds to form a resist underlayer film having a thickness of 0.5 μm. The resist underlayer film was etched using an etching system ("EXAM" manufactured by Sinko Seiki Co., Ltd.) in $CF_4/Ar/O_2$ ($CF_4$: 40 mL/min, Ar: 20 mL/min, $O_2$: 5 mL/min; pressure: 20 Pa; RF power: 200 W; processing time: 40 seconds; temperature: 15° C.). The etching rate was calculated based on the thickness of the resist underlayer film measured before and after etching. A case where the etching rate was 150 nm/min or less was evaluated as "A" (Acceptable), a case where the etching rate was more than 150 nm/min and less than 200 nm/min was evaluated as "B" (Fair), and a case where the etching rate was 200 nm/min or more was evaluated as "C" (Unacceptable).

Crack Resistance

The resist underlayer film-forming composition was spin-coated onto an 8-inch silicon wafer, heated at 180° C. for 60 seconds on a hot plate (oxygen concentration: 20 vol %), and heated at 300° C. for 60 seconds to form a resist underlayer film having a thickness of 0.7, 1.0, 1.2, or 1.5 μm. A solvent used for a three-layer resist process spin-on-glass composition solution was applied to the resist underlayer film, and heated at 200° C. and 300° C. respectively for 60 seconds on a hot plate. The substrate after heating was observed using an optical microscope. A case where no cracks were observed on the resist underlayer film was evaluated as "A" (Acceptable), and a case where one or more cracks were observed on the resist underlayer film was evaluated as "B" (Unacceptable).

TABLE 1

| | Component [A1] | | Acid generator [B] | | Crosslinking agent [C] | | Solvent | | Etching resistance | Crack resistance Thickness (μm) of resist underlayer film | | | |
|---|---|---|---|---|---|---|---|---|---|---|---|---|---|
| | Type | Amount (parts by mass) | Type | Amount (parts by mass) | Type | Amount (parts by mass) | Type | Amount (parts by mass) | | 0.7 | 1.0 | 1.2 | 1.5 |
| Example 1 | A1-1 | 20 | B-1 | 0.6 | C-1 | 2 | D-1 | 77.4 | A | A | A | A | A |
| Example 2 | A1-2 | 20 | B-1 | 0.6 | C-1 | 2 | D-1 | 77.4 | A | A | A | A | A |
| Example 3 | A1-3 | 20 | B-1 | 0.6 | C-1 | 2 | D-2 | 77.4 | A | A | A | A | A |
| Comparative Example 1 | A2-1 | 20 | B-1 | 0.6 | C-1 | 2 | D-2 | 77.4 | A | B | B | B | B |
| Comparative Example 2 | A2-2 | 20 | B-1 | 0.6 | C-1 | 2 | D-1 | 77.4 | B | B | B | B | B |

As is clear from the results shown in Table 1, it was confirmed that the resist underlayer film-forming compositions of Examples 1 to 3 could form a pattern exhibiting excellent dry etching resistance and excellent crack resistance.

Preparation of Resist Underlayer Film-forming Composition (II)

Example 4

3 parts by mass of the polymer (A1-1) (polymer [A1]), 7 parts by mass of the polymer (A2-1) (polymer [A2]), 0.3 parts by mass of diphenyliodonium trifluoromethanesulfonate (hereinafter referred to as "B-1") (thermal acid generator) (acid generator [B]), and 1 part by mass of 1,3,4,6-tetrakis(methoxymethyl)glycoluril represented by the above formula (hereinafter referred to as "C-1") (crosslinking agent [C]) were dissolved in 88.7 parts by mass of propylene glycol monomethyl ether acetate (hereinafter referred to as "D-1") (solvent). The solution was filtered through a membrane filter having a pore size of 0.1 μm to prepare a resist underlayer film-forming composition.

Each resist underlayer film-forming composition was prepared in the same manner as in Example 4, except that the type and the amount of each component were changed as shown in Table 2. Note that the solvent (D-2) in Table 2 refers to cyclohexanone. The symbol "-" in Table 2 indicates that the corresponding component was not used.

Evaluation

A resist underlayer film was formed using the resist underlayer film-forming composition, and the following properties were evaluated as described below. The results are shown in Table 2.

Warping of Substrate

The amount of warping of a wafer before applying the resist underlayer film-forming composition was measured using a system "FSM900TC-vac" (manufactured by FRONTIER SEMICONDUCTOR (USA)). The amount of warping of the wafer was calculated from the average value of the differences in height between the center and the edge of the wafer. The resist underlayer film-forming composition was spin-coated onto a 12-inch silicon wafer, and heated at 250° C. for 120 seconds on a hot plate to form a resist underlayer film having a thickness of 0.3 μm. The amount of warping of the wafer after forming the resist underlayer film was measured using the system "FSM900TC-vac". A case where the difference between the amount of warping of the wafer before applying the resist underlayer film-forming composition and the amount of warping of the wafer after forming the resist underlayer film was 10 μm or less was evaluated as "A" (Acceptable), and a case where the difference between the amount of warping of the wafer before applying the resist underlayer film-forming composition and the amount of warping of the wafer after forming the resist underlayer film was more than 10 μm was evaluated as "B" (Unacceptable).

Etching Resistance

The resist underlayer film-forming composition was spin-coated onto a 12-inch silicon wafer, and heated at 250° C. for 120 seconds on a hot plate to form a resist underlayer film having a thickness of 0.3 μm. The silicon wafer on which the resist underlayer film was formed was etched using an etching system ("EXAM" manufactured by Sinko Seiki Co., Ltd.) in $CHF_3/Ar/O_2$ (pressure: 250 mTorr, RF=500 W). The etching rate (nm/min) is shown in Table 2. It is considered that the etching resistance is high when the etching rate is low.

TABLE 2

| | Polymer [A1] | | Polymer [A2] | | Acid generator [B] | | Crosslinking agent [C] | | Solvent | | Warping of substrate | Etching rate (nm/min) |
|---|---|---|---|---|---|---|---|---|---|---|---|---|
| | Type | Amount (parts by mass) | Type | Amount (parts by mass) | Type | Amount (parts by mass) | Type | Amount (parts by mass) | Type | Amount (parts by mass) | | |
| Example 4 | A1-1 | 3 | A2-1 | 7 | B-1 | 0.3 | C-1 | 1 | D-1 | 88.7 | A | 20 |
| Example 5 | A1-2 | 3 | A2-1 | 7 | B-1 | 0.3 | C-1 | 1 | D-1 | 88.7 | A | 20 |
| Example 6 | A1-3 | 3 | A2-1 | 7 | B-1 | 0.3 | C-1 | 1 | D-1 | 88.7 | A | 20 |
| Example 7 | A1-4 | 3 | A2-1 | 7 | B-1 | 0.3 | C-1 | 1 | D-1 | 88.7 | A | 21 |
| Example 8 | A1-5 | 3 | A2-1 | 7 | B-1 | 0.3 | C-1 | 1 | D-1 | 88.7 | A | 21 |
| Example 9 | A1-1 | 3 | A2-2 | 7 | B-1 | 0.3 | C-1 | 1 | D-1 | 88.7 | A | 25 |
| Example 10 | A1-2 | 3 | A2-2 | 7 | B-1 | 0.3 | C-1 | 1 | D-1 | 88.7 | A | 24 |
| Example 11 | A1-3 | 3 | A2-2 | 7 | B-1 | 0.3 | C-1 | 1 | D-1 | 88.7 | A | 25 |

TABLE 2-continued

| | Polymer [A1] | | Polymer [A2] | | Acid generator [B] | | Crosslinking agent [C] | | Solvent | | Warping of substrate | Etching rate (nm/min) |
|---|---|---|---|---|---|---|---|---|---|---|---|---|
| | Type | Amount (parts by mass) | Type | Amount (parts by mass) | Type | Amount (parts by mass) | Type | Amount (parts by mass) | Type | Amount (parts by mass) | | |
| Example 12 | A1-4 | 3 | A2-2 | 7 | B-1 | 0.3 | C-1 | 1 | D-1 | 88.7 | A | 26 |
| Example 13 | A1-5 | 3 | A2-2 | 7 | B-1 | 0.3 | C-1 | 1 | D-1 | 88.7 | A | 25 |
| Example 14 | A1-1 | 3 | A2-3 | 7 | B-1 | 0.3 | C-1 | 1 | D-1 | 88.7 | A | 18 |
| Example 15 | A1-2 | 3 | A2-3 | 7 | B-1 | 0.3 | C-1 | 1 | D-1 | 88.7 | A | 17 |
| Example 16 | A1-3 | 3 | A2-3 | 7 | B-1 | 0.3 | C-1 | 1 | D-1 | 88.7 | A | 18 |
| Example 17 | A1-4 | 3 | A2-3 | 7 | B-1 | 0.3 | C-1 | 1 | D-1 | 88.7 | A | 19 |
| Example 18 | A1-5 | 3 | A2-3 | 7 | B-1 | 0.3 | C-1 | 1 | D-1 | 88.7 | A | 18 |
| Example 19 | A1-1 | 3 | A2-4 | 7 | B-1 | 0.3 | C-1 | 1 | D-1 | 88.7 | A | 22 |
| Example 20 | A1-2 | 3 | A2-4 | 7 | B-1 | 0.3 | C-1 | 1 | D-1 | 88.7 | A | 21 |
| Example 21 | A1-3 | 3 | A2-4 | 7 | B-1 | 0.3 | C-1 | 1 | D-1 | 88.7 | A | 22 |
| Example 22 | A1-4 | 3 | A2-4 | 7 | B-1 | 0.3 | C-1 | 1 | D-1 | 88.7 | A | 23 |
| Example 23 | A1-5 | 3 | A2-4 | 7 | B-1 | 0.3 | C-1 | 1 | D-1 | 88.7 | A | 22 |
| Example 24 | A1-1 | 3 | A2-5 | 7 | B-1 | 0.3 | C-1 | 1 | D-1 | 88.7 | A | 22 |
| Example 25 | A1-2 | 3 | A2-5 | 7 | B-1 | 0.3 | C-1 | 1 | D-1 | 88.7 | A | 22 |
| Example 26 | A1-3 | 3 | A2-5 | 7 | B-1 | 0.3 | C-1 | 1 | D-1 | 88.7 | A | 22 |
| Example 27 | A1-4 | 3 | A2-5 | 7 | B-1 | 0.3 | C-1 | 1 | D-1 | 88.7 | A | 23 |
| Example 28 | A1-5 | 3 | A2-5 | 7 | B-1 | 0.3 | C-1 | 1 | D-1 | 88.7 | A | 23 |
| Example 29 | A1-1 | 3 | A2-6 | 7 | B-1 | 0.3 | C-1 | 1 | D-1 | 88.7 | A | 25 |
| Example 30 | A1-2 | 3 | A2-6 | 7 | B-1 | 0.3 | C-1 | 1 | D-1 | 88.7 | A | 24 |
| Example 31 | A1-3 | 3 | A2-6 | 7 | B-1 | 0.3 | C-1 | 1 | D-1 | 88.7 | A | 25 |
| Example 32 | A1-4 | 3 | A2-6 | 7 | B-1 | 0.3 | C-1 | 1 | D-1 | 88.7 | A | 26 |
| Example 33 | A1-5 | 3 | A2-6 | 7 | B-1 | 0.3 | C-1 | 1 | D-1 | 88.7 | A | 25 |
| Comparative Example 3 | — | — | A2-1 | 10 | B-1 | 0.3 | C-1 | 1 | D-2 | 88.7 | B | 19 |
| Comparative Example 4 | — | — | A2-2 | 10 | B-1 | 0.3 | C-1 | 1 | D-1 | 88.7 | B | 26 |
| Comparative Example 5 | — | — | A2-3 | 10 | B-1 | 0.3 | C-1 | 1 | D-1 | 88.7 | B | 16 |
| Comparative Example 6 | — | — | A2-4 | 10 | B-1 | 0.3 | C-1 | 1 | D-2 | 88.7 | B | 21 |
| Comparative Example 7 | — | — | A2-5 | 10 | B-1 | 0.3 | C-1 | 1 | D-1 | 88.7 | B | 22 |
| Comparative Example 8 | — | — | A2-6 | 10 | B-1 | 0.3 | C-1 | 1 | D-1 | 88.7 | B | 26 |

As is clear from the results shown in Table 2, it was confirmed that warping of the substrate could be suppressed when forming the resist underlayer film using the resist underlayer film-forming compositions of Examples 4 to 33.

The embodiments of the invention thus provide a resist underlayer film-forming composition that can suppress warping of a substrate, can form a resist underlayer film that exhibits excellent etching resistance and excellent crack resistance and is suitable for a multilayer resist process that includes removing an intermediate film (e.g., inorganic film) by dry etching, and may suitably be used when transferring a deep pattern to a substrate by dry etching. The resist underlayer film-forming composition may suitably be used for production of semiconductor devices and the like for which the processing size is expected to be further reduced in the future.

Obviously, numerous modifications and variations of the invention are possible in light of the above teachings. It is therefore to be understood that within the scope of the appended claims, the invention may be practiced otherwise than as specifically described herein.

What is claimed is:
1. A pattern-forming method comprising:
applying a resist underlayer film-forming composition on a substrate to provide a resist underlayer film on the substrate, the resist underlayer film-forming composition comprising a first polymer having a glass transition temperature of 0 to 180° C. and a second polymer having a glass transition temperature of more than 180° C.;
providing a silicon-based oxide film on a surface of the resist underlayer film;
providing a resist pattern on a surface of the silicon-based oxide film using a resist composition;
sequentially dry-etching the silicon-based oxide film and the resist underlayer film using the resist pattern as a mask; and
dry-etching the substrate using the dry-etched resist underlayer film as a mask,
wherein the first polymer comprises: a structural unit represented by formula (2); and a structural unit that comprises a —CH$_2$OH group and an aromatic group,

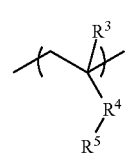

(2)

wherein
R$^3$ is a hydrogen atom, a fluorine atom, a methyl group, or a trifluoromethyl group, $R^4$ is a single bond or a chain hydrocarbon group having 1 to 4 carbon atoms, and $R^5$ is a phenyl group, a naphthyl group, or an anthranyl group, wherein some or all of the hydrogen atoms of the phenyl group, the naphthyl group, or the anthranyl group represented by $R^5$ are optionally substituted with an alkyl group, wherein the second polymer comprises a structural unit represented by formula (5), a structural unit represented by formula (6), a structural unit represented by formula (7), a structural unit that comprises a fullerene skeleton, or a combination thereof, $$\begin{array}{c} R^{13} \quad R^{14} \\ -\!\!\!\!\!\!-\!\!\!\!\!\text{C}\!\!\!\!\!-\!\!\!\!\!\!-\!\!\!\!\!\text{C}\!\!\!\!\!-\!\!\!\!\!\!- \\ \big|\phantom{XX}\big| \\ \text{(naphthalene ring)} \\ (CH_2-OR^{15})_{n4} \end{array} \quad (5)$$

wherein $R^{13}$ and $R^{14}$ are each independently a hydrogen atom, a halogen atom, an alkyl group having 1 to 6 carbon atoms, an alkoxy group having 1 to 6 carbon atoms, an alkoxycarbonyl group having 2 to 10 carbon atoms, or an aryl group having 6 to 14 carbon atoms, wherein some or all of the hydrogen atoms of the alkyl group, the alkoxy group, the alkoxycarbonyl group, or the aryl group represented by $R^{13}$ or $R^{14}$ are optionally substituted with an alkyl group, $R^{15}$ is an alkyl group having 1 to 6 carbon atoms, an acyl group having 2 to 10 carbon atoms, or an aryl group having 6 to 14 carbon atoms, wherein some or all of the hydrogen atoms of the alkyl group, the acyl group, or the aryl group represented by $R^{15}$ are optionally substituted with an alkyl group, and n4 is 0 or 1, $$\left(\text{anthracene ring with } (R^{16})_{n5} \text{ and } R^{17}\right) \quad (6)$$

wherein $R^{16}$ is a hydroxyl group, a mercapto group, an amino group, a halogen atom, a hydrocarbon group having 1 to 20 carbon atoms, an $-OR^{18}$ group, or a $-COOR^{19}$ group, $R^{18}$ is a hydrocarbon group having 1 to 20 carbon atoms, wherein some or all of the hydrogen atoms of the hydrocarbon group represented by $R^{18}$ are optionally substituted with a hydroxyl group or an epoxy group, $R^{19}$ is a monovalent hydrocarbon group having 1 to 20 carbon atoms, n5 is an integer from 0 to 6, wherein a plurality of $R^{16}$ are either identical or different when a plurality of $R^{16}$ are present, and $R^{17}$ is a single bond, an alkanediyl group having 1 to 10 carbon atoms, an arylene group having 6 to 14 carbon atoms, or an alkylene ether group, wherein some or all of the hydrogen atoms of the alkanediyl group, the arylene group, or the alkylene ether group represented by $R^{17}$ are optionally substituted with an alkyl group, $$-\!\!\!\!\!-(R^{18}-\!\!\!\text{C}\!\!\equiv\!\!\text{C}-\!\!R^{19}-\!\!\text{C}\!\!\equiv\!\!\text{C}-\!\!R^{20})-\!\!\!\!\!- \quad (7)$$

wherein $R^{18}$ to $R^{20}$ are each independently a single bond or a divalent organic group, wherein a case where all of $R^{18}$ to $R^{20}$ are single bonds is excluded, and wherein an amount of the first polymer is from 10 to 40 parts by mass based on 100 parts by mass of the first polymer and the second polymer in total, and a polystyrene-reduced weight average molecular weight of the first polymer determined by gel permeation chromatography is 5000 or more.

2. The pattern-forming method according to claim 1, wherein providing the resist underlayer film comprises:
applying the resist underlayer film-forming composition on the substrate; and
heating the resist underlayer film-forming composition at 180 to 350° C.

3. The pattern-forming method according to claim 1, wherein providing the silicon-based oxide film comprises:
applying a silicon-based oxide film-forming composition on the surface of the resist underlayer film; and
heating the silicon-based oxide film-forming composition at 180 to 350° C.

4. The pattern-forming method according to claim 1, wherein providing the resist underlayer film comprises:
applying the resist underlayer film-forming composition on the substrate; and
heating the resist underlayer film-forming composition at 180 to 350° C., and wherein providing the silicon-based oxide film comprises:
applying a silicon-based oxide film-forming composition on the surface of the resist underlayer film; and
heating the silicon-based oxide film-forming composition at 180 to 350° C.

5. The pattern-forming method according to claim 1, wherein providing the resist underlayer film comprises:
applying the resist underlayer film-forming composition on the substrate; and
heating the resist underlayer film-forming composition at a temperature equal to or higher than the glass transition temperature of the first polymer, and
wherein providing the silicon-based oxide film comprises:
applying a silicon-based oxide film-forming composition on the surface of the resist underlayer film; and
heating the silicon-based oxide film-forming composition at a temperature equal to or higher than the glass transition temperature of the first polymer.

6. The pattern-forming method according to claim 1, wherein the resist underlayer film-forming composition further comprises an acid generator.

7. The pattern-forming method according to claim 1, wherein the first polymer further comprises a structural unit represented by formula (1), a structural unit represented by formula (4), or a combination thereof, $$\begin{array}{c} R^1 \\ | \\ -\!\!\!\text{CH}_2\!-\!\!\text{C}\!-\!\!\!- \\ | \\ \text{C}\!=\!\!\text{O} \\ | \\ \text{O} \\ | \\ R^2 \end{array} \quad (1)$$

wherein $R^1$ is a hydrogen atom, a fluorine atom, a methyl group, or a trifluoromethyl group, and $R^2$ is a monovalent hydrocarbon group,

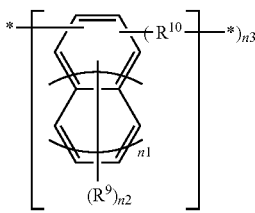

(4)

wherein
- $R^9$ is a hydroxyl group, a mercapto group, an amino group, a halogen atom, a hydrocarbon group having 1 to 20 carbon atoms, an —$OR^{11}$ group, or a —$COOR^{12}$ group,
- $R^{11}$ is a hydrocarbon group having 1 to 20 carbon atoms, wherein some or all of the hydrogen atoms of the hydrocarbon group represented by $R^{11}$ are optionally substituted with a hydroxyl group or an epoxy group,
- $R^{12}$ is a hydrocarbon group having 1 to 20 carbon atoms,
- $R^{10}$ is an alkanediyl group having 1 to 10 carbon atoms, an arylene group having 6 to 14 carbon atoms, or an alkylene ether group, wherein some or all of the hydrogen atoms of the alkanediyl group, the arylene group, or the alkylene ether group represented by $R^{10}$ are optionally substituted with an alkyl group,
- n1 is 0 or 1, n2 is an integer from 1 to 4 when n1 is 0, and is an integer from 1 to 6 when n1 is 1, n3 is an integer from 1 to 4, wherein $1 \leq n2+n3 \leq 4$ is satisfied when n1 is 0, and $1 \leq n2+n3 \leq 6$ is satisfied when n1 is 1,
- a plurality of $R^9$ are either identical or different when a plurality of $R^9$ are present, and a plurality of $R^{10}$ are either identical or different when a plurality of $R^{10}$ are present, and
- * is a bonding site.

8. The pattern-forming method according to claim 1, wherein the first polymer has the glass transition temperature of 70 to 150° C.

9. The pattern-forming method according to claim 8, wherein the second polymer has the glass transition temperature of 200° C. or more.

10. The pattern-forming method according to claim 1, wherein the second polymer has the glass transition temperature of 200° C. or more.

11. The pattern-forming method according to claim 1, wherein the resist underlayer film-forming composition further comprises a crosslinking agent.

12. The pattern-forming method according to claim 1, wherein in the formula (2), $R^5$ is a phenyl group or a naphthyl group, wherein some or all of the hydrogen atoms of the phenyl group or the naphthyl group represented by $R^5$ are optionally substituted with an alkyl group.

13. The pattern-forming method according to claim 1, wherein in the formula (2), $R^5$ is a naphthyl group, wherein some or all of the hydrogen atoms of the naphthyl group represented by $R^5$ are optionally substituted with an alkyl group.

14. The pattern-forming method according to claim 1, wherein in the formula (2), $R^4$ is a single bond.

\* \* \* \* \*